US012713712B2

(12) United States Patent
Li et al.

(10) Patent No.: US 12,713,712 B2
(45) Date of Patent: Aug. 18, 2026

(54) BACK CONTACT SOLAR CELL, METHOD FOR MANUFACTURING THE SAME, AND PHOTOVOLTAIC MODULE

(71) Applicant: ZHEJIANG JINKO SOLAR CO., LTD., Haining (CN)

(72) Inventors: Huimin Li, Haining (CN); Menglei Xu, Haining (CN); Jie Yang, Haining (CN); Xinyu Zhang, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/069,207

(22) Filed: Mar. 3, 2025

(65) Prior Publication Data

US 2025/0331314 A1 Oct. 23, 2025

(30) Foreign Application Priority Data

Apr. 22, 2024 (CN) ........................ 202410484598.X

(51) Int. Cl.
*H10F 10/16* (2025.01)
*H10F 19/80* (2025.01)
(Continued)

(52) U.S. Cl.
CPC ............. *H10F 10/16* (2025.01); *H10F 19/80* (2025.01); *H10F 77/219* (2025.01); *H10F 77/311* (2025.01)

(58) Field of Classification Search
None
See application file for complete search history.

(56) References Cited

U.S. PATENT DOCUMENTS

2009/0308438 A1* 12/2009 De Ceuster ........... H10F 10/146 257/E31.032
2014/0102531 A1 4/2014 Moslehi
(Continued)

FOREIGN PATENT DOCUMENTS

CN 115172477 A 10/2022
CN 116487450 A 7/2023
(Continued)

OTHER PUBLICATIONS

Zhejiang Jinko Solar Co., Ltd., European Search Report, EP25166462.9, Sep. 24, 2025, 8 pgs.

(Continued)

*Primary Examiner* — Ryan S Cannon
(74) *Attorney, Agent, or Firm* — USCH Law, PC

(57) ABSTRACT

Provided is a back-contact solar cell. The back-contact solar cell includes: a substrate having first doped regions, second doped regions and gap regions arranged on the substrate; first doped semiconductor layers located on the corresponding first doped regions; second doped semiconductor layers located on the corresponding second doped regions, a conductive type of a second doping element within the second doped semiconductor layer is different from that of a first doping element within the first doped semiconductor layer; a conductive layer located on part of the gap region; a passivation layer covering the first doped semiconductor layers, the second doped semiconductor layers, the conductive layers and the gap regions; first electrodes in electrical contact with the first doped semiconductor layers; and second electrodes, in electrical contact with the second doped semiconductor layers.

18 Claims, 11 Drawing Sheets

(51) Int. Cl.
*H10F 77/20* (2025.01)
*H10F 77/30* (2025.01)

(56) References Cited

U.S. PATENT DOCUMENTS

| | | | | |
|---|---|---|---|---|
| 2024/0313136 | A1* | 9/2024 | Wang | H10F 77/147 |
| 2025/0331314 | A1 | 10/2025 | Li et al. | |
| 2025/0374707 | A1* | 12/2025 | Liu | H10F 77/14 |

FOREIGN PATENT DOCUMENTS

| | | | |
|---|---|---|---|
| CN | 117133812 | A | 11/2023 |
| CN | 117334760 | A | 1/2024 |
| CN | 117558778 | A | 2/2024 |
| CN | 117637891 | A | 3/2024 |
| CN | 117650188 | A | 3/2024 |
| JP | 2017175032 | A | 9/2017 |
| KR | 20180050020 | A | 5/2018 |

OTHER PUBLICATIONS

Calcabrini Andres et al., "Low-breakdown-voltage solar cells for shading-tolerant photovoltaic modules", Cell Reports Physical Science, vol. 3, No. 12, p. 101155, Dec. 21, 2022, 17 pgs.

* cited by examiner

BACK CONTACT SOLAR CELL, METHOD FOR MANUFACTURING THE SAME, AND PHOTOVOLTAIC MODULE

CROSS REFERENCE TO RELATED APPLICATIONS

This application claims priority to Chinese Patent Application No. 202410484598.X, filed on Apr. 22, 2024, which is incorporated by reference herein in its entirety.

TECHNICAL FIELD

The present disclosure relate to the field of photovoltaic technologies, and particularly relate to a back-contact solar cell, a method for manufacturing the same and a photovoltaic module.

BACKGROUND

The interdigitated back contact (IBC) cell refers to a back-junction and back-contact solar cell structure in which the positive and negative metal electrodes are arranged in an interdigitated manner on the backlight side of the solar cell with its PN junction is located on the back side of the solar cell. The term "back-junction" refers to that the PN junction is located on the back side of the solar cell. The IBC cell is currently one of the photovoltaic cells with the highest conversion efficiency. The IBC cell uses monocrystalline silicon as the substrate in which both the PN junction and the metal electrodes are located its back side. The front side of the IBC cell is not shaded by any metal electrode, it is able to obtain a very high short-circuit current and good conversion efficiency.

A photovoltaic module composed of multiple solar cells are usually installed in an area with wide-open space and abundant sunlight. During long-term use, it's hard to avoid obstructions such as birds, dust and fallen leaves, and these obstructions will result in shadows on the photovoltaic module. In addition, in a large photovoltaic module array, shadows may be formed when the interval between modules is not appropriately set. Due to the local shadows, the current and voltage of some solar cells in the photovoltaic module will change. As a result, the product of the local current and voltage of the photovoltaic module may increase, thereby causing a local temperature rise in the photovoltaic module. Moreover, inherent defects of some solar cells within the photovoltaic module may also cause local temperature rise during operation, and this phenomenon is called as the "hot spot effect".

In the IBC cell, since both the P-type doped regions and the N-type doped regions are located on the back side of the substrate and are separated from each other, during the process of forming solar cell strings by multiple IBC cells and then encapsulating them into the photovoltaic module, the hot spot effect may adversely affect the power of the photovoltaic module and may lead to safety issues caused by the local temperature rise. Therefore, how to solve the "hot spot effect" is an urgent problem for the technicians to address.

SUMMARY

Embodiments of the present disclosure provide a back-contact solar cell, a method for manufacturing the same and a photovoltaic module, which are at least beneficial to solving the problem of the hot spot effect.

A first aspect of embodiments of the present disclosure provides a back-contact solar cell. The back-contact solar cell includes a substrate, first doped semiconductor layers, second doped semiconductor layers, at least one conductive layer, a passivation layer, first electrodes, and second electrodes. The substrate includes a plurality of first doped regions spaced apart along a first direction, a plurality of second doped regions arranged along the first direction, and gap regions. At least a portion of each of the plurality of second doped regions is between respective adjacent first doped regions of the plurality of first doped regions, and a respective gap region of the gap regions is between each first doped region and an adjacent second doped region. The first doped semiconductor layers are respectively formed on the plurality of first doped regions, where each of the plurality of first doped semiconductor layers includes a first doping element. The second doped semiconductor layers are respectively formed on the plurality of second doped regions, where each of the plurality of second doped semiconductor layers includes a second doping element, and a conductive type of the second doping element is different from a conductive type of the first doping element. Each respective conductive layer of the at least one conductive layer is formed on part of a corresponding gap region, where a first side of the respective conductive layer is in electrical contact with a respective first doped semiconductor layer, and an opposing second side of the respective conductive layer is in electrical contact with a respective second doped semiconductor layer adjacent to the respective first doped semiconductor layer. The passivation layer is formed over the first doped semiconductor layers, the second doped semiconductor layers, the at least one conductive layer and the gap regions. The first electrodes are in electrical contact with the first doped semiconductor layers. The second electrodes are in electrical contact with the second doped semiconductor layers.

In some embodiments, a ratio of a contact length where the respective conductive layer is in contact with the respective first doped semiconductor layer to an extended length of the corresponding gap region is less than or equal to 30%. In response to the first doped regions and the second doped regions being alternatingly arranged along the first direction, a length of the corresponding gap region along a second direction is the extended length of the corresponding gap region, and in response to the respective second doped region surrounding the respective first doped region, an inner circumference of the corresponding gap region is the extended length of the corresponding gap region.

In some embodiments, in response to the inner circumference of the corresponding gap region being the extended length of the corresponding gap region, the respective first doped semiconductor layer includes a long side extending along the first direction and a short side extending along the second direction, and the respective conductive layer is in electrical contact with the short side of the respective first doped semiconductor layer.

In some embodiments, a ratio of the contact length to a length of the short side is greater than or equal to 10%.

In some embodiments, the first doped semiconductor layers includes: a plurality of first portions, where the plurality of first portions are ones of the first doped semiconductor layers that are in electrical contact with the at least one conductive layer; and a plurality of second portions, where the plurality of second portions are ones of the first doped semiconductor layers that are not in direct contact with the conductive layer. N1/N≥5%, N1 is a number of the first portions, and N is a total number of the first doped semiconductor layers.

In some embodiments, 0≤N2≤10, N2 is a number of the second portions located between two adjacent first portions of the plurality of first portions.

In some embodiments, the number of the second portions between each two adjacent first portions is the same.

In some embodiments, the conductive layer is located on the substrate corresponding to a corresponding gap region, and is in electrical contact with a side surface of the respective first doped semiconductor layer.

In some embodiments, the respective first doped semiconductor layer includes an extension portion located on part of the corresponding gap region, and the respective conductive layer is in electrical contact with both a top surface and a side surface of the extension portion.

In some embodiments, the conductive layer further extends to part of a top surface of the respective first doped semiconductor layer in the respective first doped region, and the conductive layer is physically insulated from the first electrodes.

In some embodiments, a top surface of the respective second doped semiconductor layer is lower than a top surface of the respective first doped semiconductor layer, and a side surface of the respective conductive layer is a curved surface.

In some embodiments, the respective conductive layer includes a first conductive layer and a second conductive layer, the first conductive layer is located on a side surface of the respective first doped semiconductor layer, the second conductive layer is located on a top surface of the respective first doped semiconductor layer, and an acute angle is formed between a bottom surface of the first conductive layer and a bottom surface of the second conductive layer.

In some embodiments, an orthographic projection of the first conductive layer on a projection plane at least partially overlap an orthographic projection of the second conductive layer on the projection plane.

In some embodiments, a material of the respective conductive layer is substantially the same as a material of at least one of the respective first doped semiconductor layer and the respective second doped semiconductor layer.

A second aspect of the embodiments of the present disclosure provides a photovoltaic module, including: at least one solar cell string each formed by connecting multiple back-contact solar cells as described in any one of the above embodiments; a connecting member configured to electrically connect two adjacent back-contact solar cells; an encapsulation film configured to cover a surface of the at least one solar cell string; and a cover plate configured to cover a surface of the encapsulation film that is away from the at least one solar cell string.

BRIEF DESCRIPTION OF THE DRAWINGS

One or more embodiments are illustrated by the corresponding figures in the drawings. These exemplary illustrations do not constitute limitations on the embodiments. Unless otherwise specified, the figures in the drawings are not subject to scale limitations. In order to explain the technical solutions in embodiments of the present disclosure or in the conventional technologies more clearly, a brief introduction to the drawings used in embodiments will be provided below. It is understandable that, the drawings in the following description are only some embodiments of the present disclosure. For those of ordinary skill in the art, some other drawings can also be obtained based on these drawings without creative efforts.

DETAILED DESCRIPTION OF THE EMBODIMENTS

Figure 1:
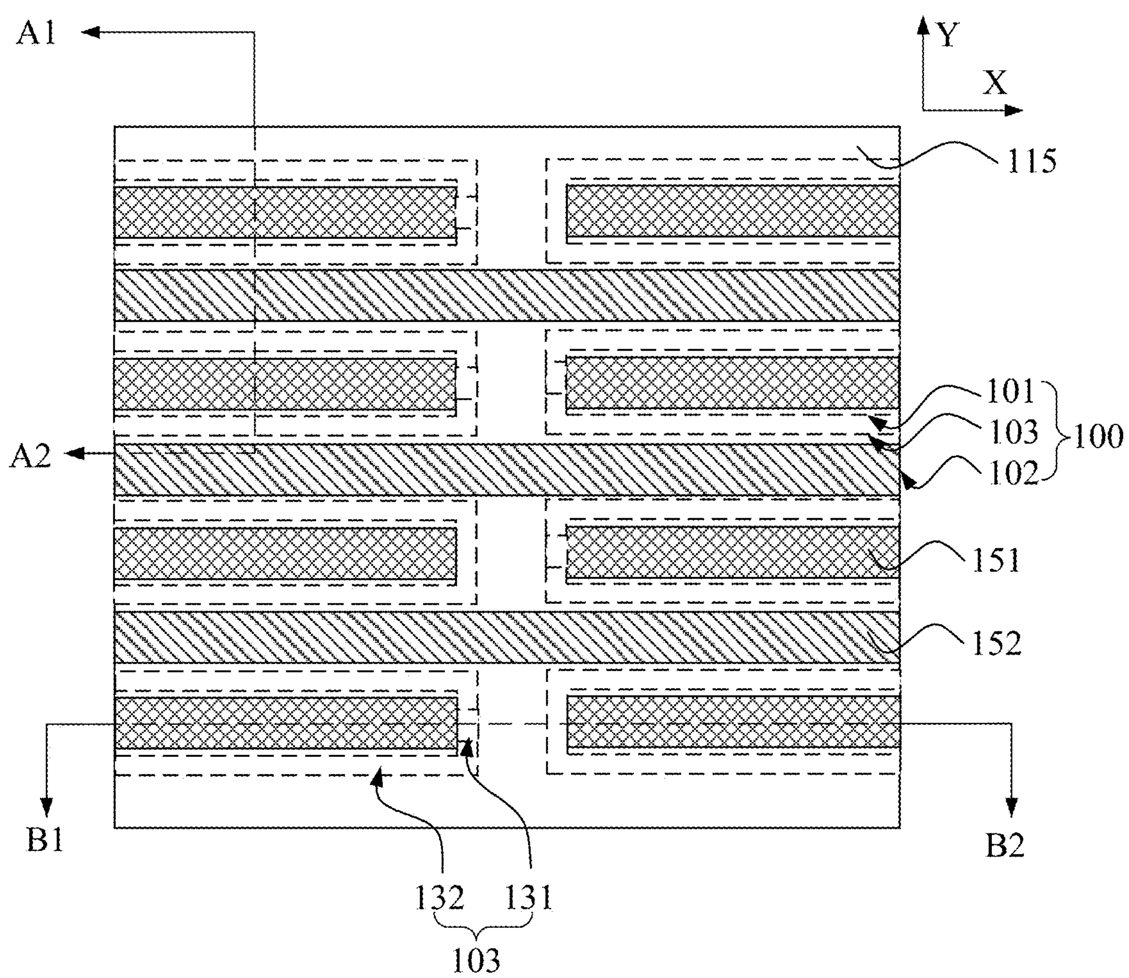
FIG. 1 is a schematic structural diagram of a back-contact solar cell according to one or more embodiments of the present disclosure.

It can be seen from the background art, the conventional back-contact solar cells and photovoltaic modules suffer from the problem of the "hot spot effect", which may lead to loss of efficiency of the photovoltaic cell.

Through analysis, it is found that one of the reason that causes the current back-contact solar cells and photovoltaic modules suffer from the problem of the "hot spot effect" lies in the fact that the shading of the back-contact solar cell is a common event that may happen on site. It's caused by the existing shading objects (like telegraph poles or trees) and/or by fragments that drop onto the module or the dirt that gathers on the module. Shading part of the back-contact solar cell can cause the diode to enter reverse bias, which may lead to power dissipation instead of power generation and cause temperature rise of the back-contact solar cell. This will reduce the performance of the system, may lead to the solar cell breakdown, and if hot spots are generated, it will also lead to potential reliability risks.

One solution to this problem is to insert a bypass diode into the circuit in the junction box of the photovoltaic module so that when the solar cell or solar cell group enters reverse bias, the bypass diode is activated and the solar cell string containing the damaged solar cell is removed. For example, for a photovoltaic module with 3 solar cell strings (12-18 solar cells), this means that the shading event of a single solar cell will result in a loss of ⅓ of the power from the panel. In addition, the cost of the diode is not ignorable and it should be considered in the balance between the material cost of the module and the total cost per watt. The cascaded protection is not perfect, and some hot spots may not conduct the cascaded diodes, and reliability risks may still exist. Moreover, in such situations, hot spot screening is still required, and the resistance to shading is poor. Shading may also cause significant losses in residential applications where many rooftops have the inherent shading, as well as in concentrated PV applications.

Based on this, embodiments of the present disclosure provide a back-contact solar cell. In the back-contact solar cell, the substrate includes a first doped region, a second doped region and a gap region, and further includes a first doped semiconductor layer located on the first doped region, a second doped semiconductor layer located on the second doped region and a conductive layer located on part of the gap region. Two sides of the conductive layer are respectively in electrical contact with the first doped semiconductor layer and the second doped semiconductor layer. Firstly, the conductive layer itself, as a connection layer, electrically connects the first doped semiconductor layer and the second doped semiconductor layer to realize the electrical transmission therebetween, so as to achieve shunting of opposite polarities, thus forming a bypass diode. It can effectively balance and improve the increased local current and voltage of the back-contact solar cell itself due to the "hot spot effect", and can further improve and compensate for the problems brought about by the "hot spot effect". It is therefore possible to prevent issues from occurring with one solar cell string and effectively avoid the problem of power reduction of the solar cell string due to the shading event.

In addition, the back-contact solar cell includes at least one conductive layer. Each conductive layer itself, as an electrical transmission channel, electrically connects the first doped semiconductor layer and the second doped semiconductor layer. This electrical transmission channel can serve as a channel for the leakage current of the tunnel junction between P-type doped ions and N-type doped ions (minority carriers and majority carriers), decentralizing the leakage current channel previously in one position, i.e., provide more leakage current discharging positions, thereby relieving the pressure on the single leakage current channel and evenly discharging the leakage current in various places, so as to controllably regulate and solve the leakage current problem of the solar cell, and then effectively reduce the high voltage or overheat events in one electrical contact region or multiple leakage current regions in the back-contact solar cell, so that the "hot spot effect" caused by the local overheating problem can be solved.

As used herein, the terms "vertical", "longitudinal", "horizontal" and "transverse" refer to the principal plane of the structure and are not necessarily defined by the gravitational field of the earth. The "horizontal" or "transverse" direction refers to a direction that is generally parallel to the principal plane of the structure, while the "vertical" or "longitudinal" direction is a direction that is generally perpendicular to the principal plane of the structure. The principal plane of a structure is defined by the surface of the structure that has a relatively larger area compared to other surfaces of the structure. Referring to the drawings, the "horizontal" or "transverse" direction may be perpendicular to the indicated "Z" axis, and may be parallel to the indicated "X" axis and/or parallel to the indicated "Y" axis, while the "vertical" or "longitudinal" direction may be parallel to the indicated "Z" axis, and may be perpendicular to the indicated "X" axis and the indicated "Y" axis.

As used herein, features (e.g., regions, structures, devices) described as being "adjacent" to each other mean and include those that are positioned nearest (e.g., closest) to each other and have one or more identities that have been disclosed. Additional features that do not match one or more identities that have been disclosed of the "adjacent" features (e.g., additional regions, additional structures, additional devices) may be placed between the "adjacent" features. In other words, "adjacent" features may be positioned directly adjacent to each other such that no other features placed between the "adjacent" features. Alternatively, "adjacent" features may be positioned indirectly adjacent to each other such that at least one feature which has identifiers other than those associated with at least one of the "adjacent" features is located between the "adjacent" features. Thus, features described as being "vertically adjacent" to each other mean and include features with one or more identities that have been disclosed and that are located vertically nearest (e.g., vertically closest) to each other. Furthermore, features described as being "horizontally adjacent" to each other mean and include features with one or more identities that have been disclosed and that are located horizontally nearest (e.g., horizontally closest) to each other.

In the following description, any of the following situations, namely, a second component being formed or provided above or on a first component, a second component being formed or provided on the surface of a first component, and a second component being formed or provided on one side of a first component, both include one or more embodiments where the first component and the second component are in direct contact and one or more embodiments where there may be one or more additional components between the first component and the second component so that the first component and the second component are not in direct contact. For simplicity and clarity, various components may be drawn at different scales arbitrarily. In the drawings, some layers/components may be omitted for simplification.

Unless otherwise specified, when a second component is formed or provided on the surface of a first component, it means that the first component and the second component are in direct contact.

The above-mentioned "components" may refer to layers, films, regions, portions, structures, members, etc.

Moreover, for the convenience of description, interval relative terms such as "under", "below", "lower", "above", "upper" and the like may be used herein to describe the relationship between one element or component or member and another (or others) as shown in the drawings. In addition to the orientations shown in the drawings, the interval relative terms are intended to include different orientations of devices during use or operation. The devices may be oriented in other ways (rotated by 90 degrees or in other orientations), and the interval relative descriptors used herein may be correspondingly interpreted. Additionally, the term "made of" may mean "including" or "composed of". Furthermore, during the subsequent manufacturing processes, there may be one or more additional operations during/between the described operations, and the sequence of operations may be changed. In the following embodiments, the terms "upper", "above" and/or "on" are defined in the direction where the distance from the front surface and the rear surface increases. Materials, configurations, dimensions, processes and/or operations as illustrated in some embodiments may be adopted in other embodiments, and detailed descriptions thereof can be omitted.

As used herein, spatial relative terms such as "below", "under", "lower", "bottom", "above", "upper", "top", "front", "rear", "left", "right" and the like may be used for the convenience of description to describe the relationship between one element or feature and another element or feature as illustrated in the drawings. Unless otherwise specified, the spatial relative terms are intended to cover different orientations of materials other than the orientation depicted in the illustrations. For example, if the materials in the illustration is inverted, an element described as "under" or "below" or "beneath" or "at the bottom of" other elements or features will be oriented as "above" or "at the top of" the other elements or features. Therefore, the term "below" may cover both upward and downward orientations depending on the context in which the term is used, which will be obvious to those of ordinary skill in the art. Materials may be oriented in other ways (for example, rotated by 90 degrees, inverted, flipped), and the spatial relative descriptors used herein may be interpreted accordingly.

As used herein, unless the context clearly specifies otherwise, the singular forms "a/an" and "the" are intended to include the plural forms as well. As used herein, "and/or" includes any and all combinations of one or more of the associated listed items.

As used herein, the terms "substantially" or "essentially" with respect to a given parameter, property or condition mean and include the extent to which the given parameter, property or condition conforms to a deviation degree (for example, within an acceptable tolerance) as would be understood by a person of ordinary skill in the art. By examples, depending on the specific parameter, property or condition that is substantially satisfied, the parameter, property or condition may be satisfied by at least 90.0%, at least 95.0%, at least 99.0%, at least 99.9%, or even 100.0%.

As used herein, "about", "approximately" or "around" with reference to a value of a specific parameter includes the value, and the deviation degree of the value is within the acceptable tolerance of the specific parameter as would be understood by a person of ordinary skill in the art. For example, "about" or "approximately" with respect to a value may include additional values within the range of 90.0% to 110.0% of the value, for example, within the range of 95.0% to 105.0% of the value, within the range of 97.5% to 102.5% of the value, within the range of 99.0% to 101.0% of the value, within the range of 99.5% to 100.5% of the value or within the range of 99.9% to 100.1% of the value.

As used herein, "conductive material" mean and include conductive materials such as one or more of the following: metals (for example, tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminium (Al)), alloys (for example, Co-based alloys, Fe-based alloys, Ni-based alloys, Fe and Ni-based alloys, Co and Ni-based alloys, Fe and Co-based alloys, Co, Ni and Fe-based alloys, Al-based alloys, Cu-based alloys, Mg-based alloys, Ti-based alloys, steel, mild steel, stainless steel), materials containing conductive metals (for example, conductive metal nitrides, conductive metal silicides, conductive metal carbides, conductive metal oxides) and conductive doped semiconductor materials (for example, conductive doped polysilicon, conductive doped germanium (Ge), conductive doped silicon germanium (SiGe)). Additionally, "conductive structure" means and includes a structure formed of and containing conductive materials.

As used herein, "insulating material" means and includes electrically insulating materials such as one or more of the following: at least one dielectric oxide material (for example, one or more of silicon oxide (SiOx), phosphosilicate glass, borosilicate glass, borophosphosilicate glass, fluorosilicate glass, aluminum oxide (AlOx), hafnium oxide (HfOx), niobium oxide (NbOx), titanium oxide (TiOx), zirconium oxide (ZrOx), tantalum oxide (TaOx) and magnesium oxide (MgOx)), at least one dielectric nitride material (for example, silicon nitride (SiNy)), at least one dielectric oxynitride material (for example, silicon oxynitride (SiOxNy)), at least one dielectric carbon oxide material (for example, silicon carbon oxide (SiOxCy)), at least one hydrogenated dielectric carbon oxide material (for example, hydrogenated silicon carbon oxide (SiCxOyHz)), and at least one dielectric carbon oxynitride material (for example, silicon carbon oxynitride (SiOxCzNy)). The chemical formulas containing one or more of "x", "y" and "z" herein (for example, SiOx, AlOx, HfOx, NbOx, TiOx, SiNy, SiOxNy, SiOxCy, SiCxOyHz, SiOxCzNy) represent materials with the average ratio of "x" atoms of one element, "y" atoms of another element and "z" atoms of an additional element (if any) to each atom of another element (for example, Si, Al, Hf, Nb, Ti). Since the chemical formulas represent relative atomic ratios rather than strict chemical structures, the insulating materials may include one or more stoichiometric compounds and/or one or more non-stoichiometric compounds, and the values of "x", "y" and "z" (if any) may be integers or non-integers. As used herein, the term "non-stoichiometric compounds" mean and include compounds composed of certain elements that cannot be represented by the ratio of clearly defined natural numbers and violate the law of definite proportions. Additionally, "insulating structure" means and includes a structure formed of and containing insulating materials.

Unless the context specifies otherwise, the materials described herein may be formed by any suitable techniques, which include but are not limited to spin coating, blanket coating, chemical vapor deposition (CVD), plasma-enhanced CVD (PECVD), atomic layer deposition (ALD), plasma-enhanced ALD (PEALD), physical vapor deposition (PVD) (for example, sputtering), or epitaxial growth. Depending on the specific materials to be formed, the techniques for depositing or growing the materials can be selected by a person of ordinary skill in the art. Additionally, unless the context specifies otherwise, the removal of the materials described herein may be achieved by any suitable techniques, which include but are not limited to etching (for example, dry etching, wet etching, vapor etching), ion milling, planarization by grinding (for example, chemical mechanical planarization (CMP)) or other known methods.

The term "semiconductor" used herein may refer to, for example, a material layer, a base, a wafer or a substrate, and includes any substrate semiconductor structure. "Semiconductor" should be understood to include silicon-on-sapphire (SOS) technology, silicon-on-insulator (SOI) technology, thin-film transistor (TFT) technology, a doped and undoped semiconductor, an epitaxial silicon layer supported by a substrate semiconductor structure, and other semiconductor structures well known to those skilled in the art. Furthermore, when a semiconductor is referred to in the following description, regions/junctions may have already been formed in the substrate semiconductor structure by previous process steps, and the term semiconductor may include the underlying layer containing such regions/junctions.

Unless it is obvious from the context, the term "conductive" and its various related forms used herein, such as "conduct", "conducting", "conduction", "conductively", "conductivity", etc., refer to electrical conductivity. Similarly, unless apparently obtained from the context, the term "couple" and its various related forms used herein, such as "connect", "connected", "connection", etc., refer to electrical connection.

Embodiments of the present disclosure will be illustrated in detail below in combination with the drawings. However, person of ordinary skill in the art can understand that in embodiments of the present disclosure, many technical details are provided to help readers better understand the present disclosure. Nevertheless, even without these technical details and various changes and modifications based on the following embodiments, the technical solutions protected by the present disclosure can still be achieved.

Figure 2:
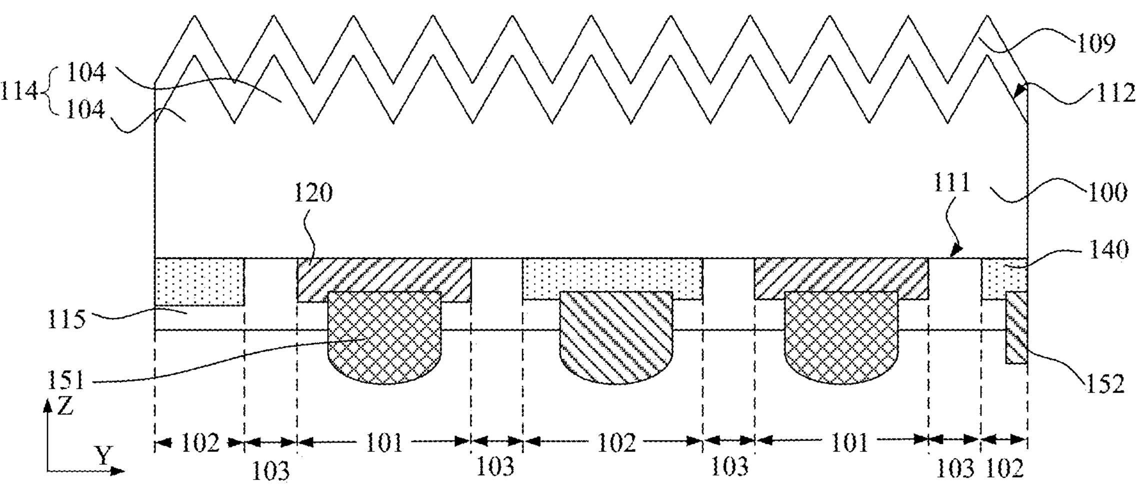
FIG. 2 is a schematic diagram of a first sectional structure along A1-A2 section in FIG. 1.
Figure 3:
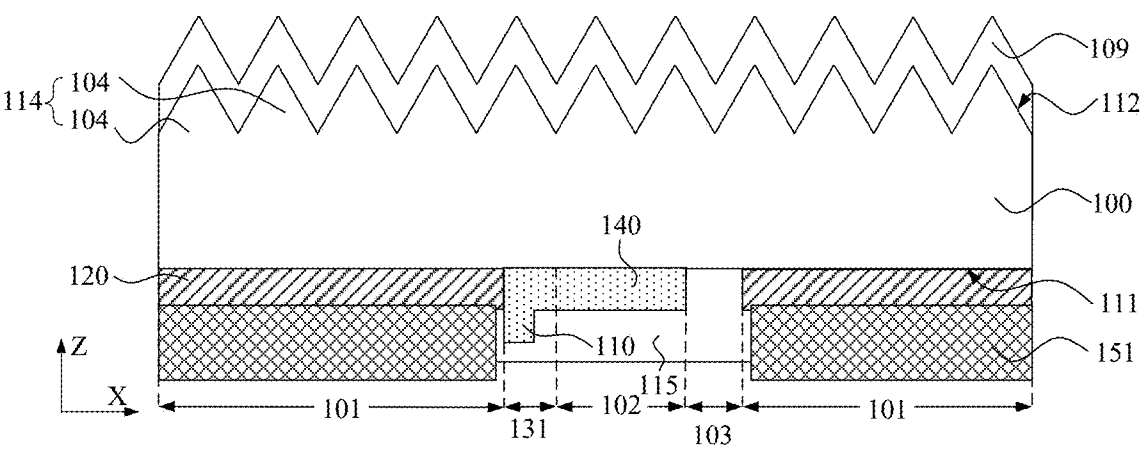
FIG. 3 is a schematic diagram of a first sectional structure along B1-B2 section in FIG. 1.

FIG. 1 is a schematic structural diagram of a back-contact solar cell according to one or more embodiments of the present disclosure. FIG. 2 is a schematic diagram of a first sectional structure along the A1-A2 section in FIG. 1. FIG. 3 is a schematic diagram of a first sectional structure along the B1-B2 section in FIG. 1. The regions surrounded by dotted lines in FIG. 1 are the first doped region, the gap region and the second doped region.

Referring to FIG. 1 to FIG. 3, embodiments of the present disclosure provide a back-contact solar cell, which includes a substrate 100. The substrate 100 includes a plurality of first doped regions 101 spaced apart along a first direction Y, a plurality of second doped regions 102 arranged along the first direction Y, and gap regions 103. At least a portion of each of the plurality of second doped regions 102 is between respective adjacent first doped regions 101 of the plurality of first doped regions 101. A respective gap region 103 of the gap regions 103 is between each first doped region 101 and an adjacent second doped region 102.

In one or more embodiments, a material of the substrate 100 may be an elemental semiconductor material. For example, the elemental semiconductor material is composed of a single element, such as silicon or germanium. The elemental semiconductor material may be in a monocrystalline state, a polycrystalline state, an amorphous state or a microcrystalline state (a state having both monocrystalline state and amorphous state is called a microcrystalline state). For example, silicon may be at least one of monocrystalline silicon, polycrystalline silicon, amorphous silicon or microcrystalline silicon.

In one or more embodiments, a material of the substrate 100 may also be a compound semiconductor material. The common compound semiconductor material includes, but is not limited to, silicon germanium, silicon carbide, gallium arsenide, indium gallium, perovskite, cadmium telluride, copper indium selenide and other materials. The substrate 100 may also be a sapphire substrate, a silicon-on-insulator substrate or a germanium-on-insulator substrate.

In one or more embodiments, the substrate 100 may be an N-type semiconductor substrate or a P-type semiconductor substrate. The N-type semiconductor substrate is doped with an N-type doping element, and the N-type doping element may be any one of Group V elements such as phosphorus (P) element, bismuth (Bi) element, antimony (Sb) element or arsenic (As) element. The P-type semiconductor substrate is doped with a P-type element, and the P-type doping element may be any one of Group III elements such as boron (B) element, aluminum (Al) element, gallium (Ga) element or indium (In) element.

In one or more embodiments, the substrate 100 has a front side 112 and a back side 111 which are oppositely arranged. The terms "front" and "back" in the front side and the back side are relative. That is to say, "front" refers to the side facing sunlight along the vertical direction, and "back" refers to the side facing away from sunlight along the vertical direction.

In one or more embodiments, the back-contact solar cell is a single-sided cell, and the front side 112 can serve as a light-receiving surface for receiving incident light, while the back side 111 serves as a backlight surface. The backlight surface can also receive incident light, but the efficiency of receiving incident light on the backlight surface is lower than that on the light-receiving surface.

In one or more embodiments, the back-contact solar cell is a double-sided cell, that is, both the front side and the back side of the substrate can serve as light-receiving surfaces and can be used to receive incident light.

In one or more embodiments, the back side 111 has a plurality of first doped regions 101 arranged along the first direction Y. Second doped regions 102 are each arranged between adjacent first doped regions 101. Gap regions 103 area each arranged between adjacent first doped region 101 and second doped region 102.

In one or more embodiments, the first doped region 101 refers to the region where the orthographic projection of the first electrode 151 on the reference plane is located, and the first doped region 101 serves as a functional region for forming the first type of metal electrode. Similarly, the second doped region 102 refers to the region where the orthographic projection of the second electrode on the reference plane is located, and the second doped region 102 serves as a functional region for forming the second type of metal electrode. The gap region 103 refers to the region where the orthographic projections of the first electrode 151 and the second electrode 152 on the reference plane do not overlap. That is, the gap region serves as a functional region where no metal electrode is formed. In other words, the first doped region 101, the second doped region 102 and the gap region 103 (also known as the non-metal electrode region) are regions set by functionally partitioning the substrate 100 (back side 111) to illustrate the distribution of each film layer structure of the back-contact solar cell. In fact, all these three regions belong to the substrate 100 (back side 111), and there is no boundary distinction between different regions, with the only difference that the film layers thereon might be different. For example, the first doped semiconductor layer 120 is on the first doped region 101, the second doped semiconductor layer 140 is on the second doped region 102, and the conductive layer 110 is on part of the gap region 103.

It is worth noting that, in order to ensure that the film layers in contact with the first electrode 151 and the second electrode 152 are the corresponding functional film layers. The range of the first doped region 101 is set to be greater than or equal to the range of the orthographic projection of the first electrode 151 on the reference plane. That is to say, any orthographic projection of the first electrode 151 on the reference plane is located within the first doped region 101, and the distance between the edge of the first doped region 101 and the edge of the orthographic projection of the first electrode 151 is greater than or equal to 0. Similarly, the range of the second doped region 102 is greater than or equal to the range of the orthographic projection of the second electrode 152 on the reference plane. The reference plane is a flat plane perpendicular to the thickness direction Z of the substrate. The reference plane is parallel to the surface formed by the second direction X and the first direction Y.

In one or more embodiments, the first doped region 101 is one of an N region and a P region, and the second doped region 102 is the other one of the N region and the P region.

Continuing to refer to FIG. 2, the back-contact solar cell includes: first doped semiconductor layers 120, where the first doped semiconductor layers 120 are located on the corresponding first doped regions 101, each first doped semiconductor layer 120 contains a first doping element; and second doped semiconductor layers 140, where the second doped semiconductor layers 140 are located on the corresponding second doped regions 102, each second doped semiconductor layer 140 contains a second doping element, and the conductive type of the second doping element is different from the conductive type of the first doping element.

In one or more embodiments, the first doped semiconductor layer 120 is one of an N-type doped layer and a P-type doped layer, and the second doped semiconductor layer 140 is the other one of the N-type doped layer and the P-type doped layer.

In one or more embodiments, the doping element in the first doped semiconductor layer 120 has the same conductive type as the doping element in the substrate 100. For example, if there is an N-type doping element in the substrate 100, there is an N-type doping element in the first doped semiconductor layer 120. Alternatively, if there is a P-type doping element in the substrate 100, there is a P-type doping element in the first doped semiconductor layer 120. In this way, the doping elements in the first doped semiconductor layer 120 and the substrate 100 are of the same conductive type. By setting the concentration of the doping element in the first doped semiconductor layer 120 to be greater than that in the substrate 100, a high-low junction is formed between the substrate 100 and the first doped semiconductor layer 120. Under the action of the built-in electric field constructed by the high-low junction, carriers can quickly migrate from the substrate 100 to the first doped semiconductor layer 120 and then be collected by the first electrode.

The doping element in the second doped semiconductor layer 140 has a different conductive type from the doping element in the substrate 100. For example, if there is an N-type doping element in the substrate 100, there is a P-type doping element in the second doped semiconductor layer 140. Alternatively, if there is a P-type doping element in the substrate 100, there is an N-type doping element in the second doped semiconductor layer 140. In this way, a PN junction is formed between the substrate 100 and the second doped semiconductor layer 140, and minority carriers and majority carriers flow to the corresponding P region and N region under their respective forces, which is conducive to accelerating the mobility of carriers.

In one or more other embodiments, the above configuration is inversed. For example, the doping element in the first doped semiconductor layer 120 has a different conductive type from that of the doping element in the substrate 100, and the doping element in the second doped semiconductor layer 140 has the same conductive type as that of the doping element in the substrate 100. This will not be elaborated in detail here.

In one or more embodiments, the first doped semiconductor layer 120 is located on the back side 111 of the substrate 100. The first doped semiconductor layer 120 is in direct contact with the substrate 100, and there is no additional film layer between them. Further, the first doped semiconductor layer 120 and the substrate 100 can be obtained from the same initial substrate through different diffusion processes.

In one or more embodiments, a material of the first doped semiconductor layer 120 may be an elemental semiconductor material or a compound semiconductor material.

Figure 4:
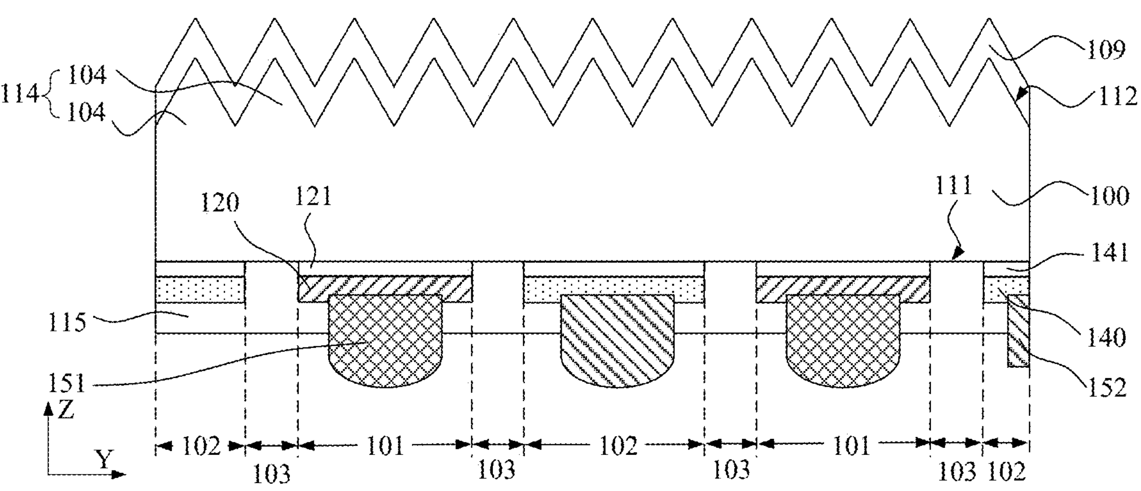
FIG. 4 is a schematic diagram of a second sectional structure along A1-A2 section in FIG. 1.
Figure 5:
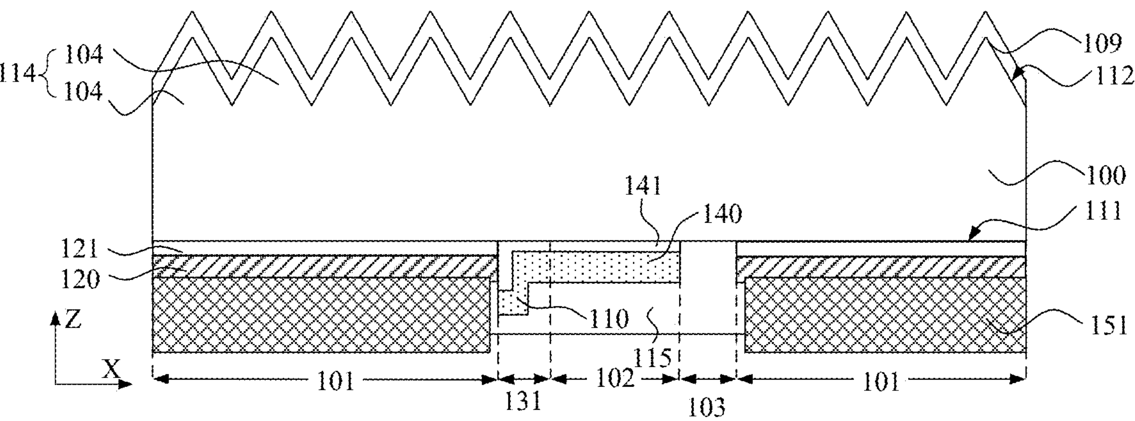
FIG. 5 is a schematic diagram of a second sectional structure along B1-B2 section in FIG. 1.
Figure 6:
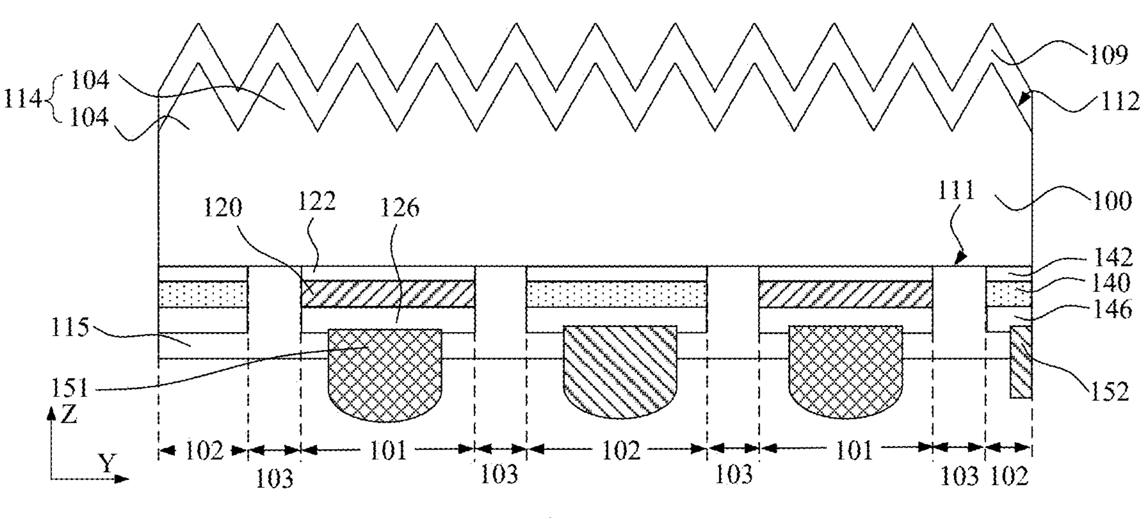
FIG. 6 is a schematic diagram of a third sectional structure along A1-A2 section in FIG. 1.
Figure 7:
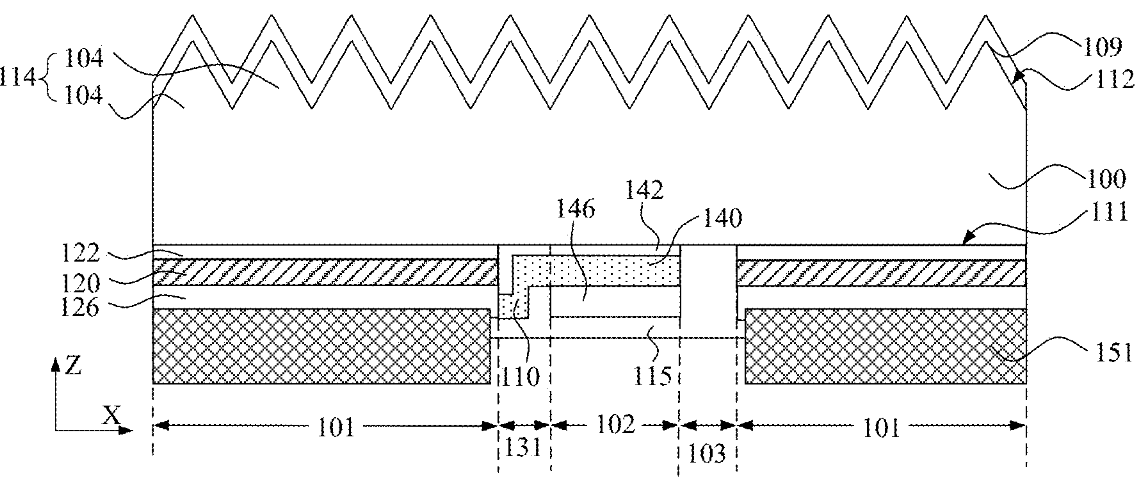
FIG. 7 is a schematic diagram of a third sectional structure along B1-B2 section in FIG. 1.

FIG. 4 is a schematic diagram of a second sectional structure along the A1-A2 section in FIG. 1. FIG. 5 is a schematic diagram of a second sectional structure along the B1-B2 section in FIG. 1. FIG. 6 is a schematic diagram of a third sectional structure along the A1-A2 section in FIG. 1. FIG. 7 is a schematic diagram of a third sectional structure along the B1-B2 section in FIG. 1.

In one or more embodiments, referring to FIG. 4 or FIG. 6, the first doped semiconductor layer 120 is located on the back side 111 of the substrate 100, and there is a first dielectric layer provided between the first doped semiconductor layer 120 and the substrate 100, which means they are not in direct contact.

The first dielectric layer includes two configurations, and accordingly the first doped semiconductor layer 120 also corresponds to two configurations, which will be described below in combination with relevant drawings.

The first configuration: referring to FIG. 4 and FIG. 5, the first tunneling dielectric layer 121 serves as the first dielectric layer, and then a passivation contact structure is formed between the first dielectric layer and the first doped semiconductor layer 120.

In one or more embodiments, the first doped semiconductor layer 120 may form an energy band bending on the surface of the substrate 100, and the first tunneling dielectric layer 121 leads to an asymmetrical shift of the energy band on the surface of the substrate 100, so that the barrier for majority carriers is lower than that for minority carriers. Therefore, majority carriers can more easily undergo quantum tunneling through the first tunneling dielectric layer 121, while minority carriers have great difficulty passing through the first tunneling dielectric layer 121, so as to achieve the selective transmission of carriers.

In addition, the first tunneling dielectric layer 121 has the chemical passivation effect. For example, due to the existence of interface state defects at the interface between the substrate 100 and the first tunneling dielectric layer 121, the interface state density on the back side 111 is relatively large. The increase of the interface state density will promote the recombination of photogenerated carriers, increase the fill factor, short-circuit current and open-circuit voltage of the back-contact solar cell, so as to improve the photoelectric conversion efficiency of the back-contact solar cell. By setting the first tunneling dielectric layer 121 on the back side 111, the first tunneling dielectric layer 121 has the chemical passivation effect on the surface of the substrate 100. For example, it reduces the defect state density of the substrate 100 and the recombination center of the substrate 100 by saturating the dangling bonds of the substrate 100 to reduce the carrier recombination rate.

The first doped semiconductor layer 120 has the field passivation effect. For example, an electrostatic field directed towards the inside of the substrate 100 is formed on the surface of the substrate 100, so that minority carriers escape from the interface, thereby reducing the concentration of the minority carriers, reducing the carrier recombination rate at the interface of the substrate 100, and thus increasing the open-circuit voltage, short-circuit current and fill factor of the back-contact solar cell, and improving the photoelectric conversion efficiency of the back-contact solar cell.

In one or more embodiments, the thickness of the first tunneling dielectric layer 121 is within the range of 0.5 nm to 10 nm. The thickness of the first tunneling dielectric layer 121 may be within the range of 0.5 nm to 1.3 nm, 1.3 nm to 4.6 nm, 4.6 nm to 6.1 nm or 6.1 nm to 10 nm. When the thickness of the first tunneling dielectric layer 121 is within any of the above ranges, the thickness of the first tunneling dielectric layer 121 is relatively thin, so that majority carriers can more easily undergo quantum tunneling through the first tunneling dielectric layer 121, while minority carriers have great difficulty passing through the first tunneling dielectric layer 121, thus achieving the selective transmission of carriers.

In one or more embodiments, a material of the first tunneling dielectric layer 121 includes at least one of silicon oxide, amorphous silicon, microcrystalline silicon, nanocrystalline silicon or silicon carbide.

In one or more embodiments, the first doped semiconductor layer 120 includes at least one of a doped amorphous silicon layer, a doped polysilicon layer, a doped microcrystalline silicon layer, a doped silicon carbide layer or a doped crystalline silicon layer.

The second configuration: referring to FIG. 6 and FIG. 7, the first intrinsic dielectric layer 122 serves as the first dielectric layer, and a heterojunction structure is formed among the first intrinsic dielectric layer 122, the first doped semiconductor layer 120 and the substrate 100. The back-contact solar cell further includes a first transparent conductive layer 126, the first transparent conductive layer 126 is located on the surface of the first doped semiconductor layer 120, and the first electrode 151 is in contact with the first transparent conductive layer 126. The heterojunction structure enables the interface where the first intrinsic dielectric layer 122 contacts the substrate 100 to form a higher open-circuit voltage, and further achieve a better passivation effect, thereby making it easier to improve the conversion efficiency.

In one or more embodiments, a material of the first intrinsic dielectric layer 122 includes intrinsic amorphous silicon, intrinsic microcrystalline silicon, intrinsic silicon oxide, intrinsic silicon nitride, nanocrystalline silicon or intrinsic silicon carbide. The optional range of the thickness of the first intrinsic dielectric layer 122 is greater than or equal to 2 micrometers and less than or equal to 10 micrometers, preferably 5 micrometers. In some cases, due to the influence of the diffusion or doping process conditions of other subsequently prepared film layers, the intrinsic dielectric layer may also contain a small amount of doping elements.

In one or more embodiments, the second doped semiconductor layer 140 includes a composite film layer formed by stacking one or more of the semiconductor thin films that are either N-type doped or P-type doped, such as amorphous silicon, amorphous silicon oxide, amorphous silicon carbide, microcrystalline silicon, hydrogenated microcrystalline silicon, microcrystalline silicon oxide, microcrystalline silicon carbide or polysilicon semiconductor films.

The use of hydrogenated microcrystalline silicon can have a larger bandgap and a narrower absorption spectrum range, so it can effectively improve the photoelectric conversion efficiency of the solar cell. Moreover, as the crystallization rate increases, the series resistance will reduce and the fill factor will increase, which can achieve the effect of increasing the output current of the solar cell and thus effectively prolonging the life of the solar cell.

In one or more embodiments, the first transparent conductive layer 126 may include at least one of indium tin oxide (ITO), aluminum-doped zinc oxide (AZO), cerium-doped indium oxide, and tungsten-doped indium oxide.

The second doped semiconductor layer 140 may also include the above-mentioned multiple configurations. For example, in some cases, referring to FIG. 2, the second doped semiconductor layer 140 is in direct contact with the substrate 100. In some cases, referring to FIG. 4, there is a second tunneling dielectric layer 141 (the second dielectric layer) between the second doped semiconductor layer 140 and the substrate 100. In some cases, referring to FIG. 6, there is a second intrinsic dielectric layer 142 (the second dielectric layer) between the second doped semiconductor layer 140 and the substrate 100, the surface of the second doped semiconductor layer 140 is provided with a second transparent conductive layer 146, and the second electrode 152 is in electrical contact with the second transparent conductive layer 146.

In one or more embodiments, the film layer structures of the first doped semiconductor layer 120 on the first doped region 101 and the second doped semiconductor layer 140 on the second doped region 102 may be the same or different. For example, in the back-contact solar cell shown in FIG. 2, the first doped semiconductor layer 120 on the first doped region 101 is in direct contact with the substrate 100, and the second doped semiconductor layer 140 on the second doped region 102 is also in direct contact with the substrate 100. In the back-contact solar cell shown in FIG. 4, the first tunneling dielectric layer 121 and the first doped semiconductor layer 120 are provided on the first doped region 101, and the first electrode 151 is in contact with the first doped semiconductor layer 120. The second tunneling dielectric layer 141 and the second doped semiconductor layer 140 are formed on the second doped region 102, and the second electrode 152 is in contact with the second doped semiconductor layer 140. In the back-contact solar cell shown in FIG. 6, the first intrinsic dielectric layer 122, the first doped semiconductor layer 120 and the first transparent conductive layer 126 are formed on the first doped region 101, and the first electrode 151 is in contact with the first transparent conductive layer 126. The second intrinsic dielectric layer 142, the second doped semiconductor layer 140 and the second transparent conductive layer 146 are formed on the second doped region 102, and the second electrode 152 is in contact with the second transparent conductive layer 146.

Continuing to refer to FIG. 3, the back-contact solar cell includes: at least one conductive layer 110. The conductive layer 110 is located on part of the gap region 103. One side of the conductive layer 110 is in electrical contact with the first doped semiconductor layer 120, and the other side of the conductive layer 110 is in electrical contact with the second doped semiconductor layer 140. The conductive layer 110 itself, as a connecting layer, electrically connects the first doped semiconductor layer 120 and the second doped semiconductor layer 140 to realize the electrical transmission therebetween, so as to achieve the shunting of opposite polarities, thus forming a bypass diode. It can effectively balance and improve the increased local current and voltage of the back-contact solar cell itself due to the "hot spot effect", and can further improve and compensate for the problems brought about by the "hot spot effect". It is therefore possible to avoid issues from occurring in one solar cell string, and effectively ensuring the power of the solar cell string due to the shadow shading event.

In addition, the back-contact solar cell includes multiple conductive layers 110. Each conductive layer 110, as an electrical transmission channel, electrically connects the first doped semiconductor layer 120 and the second doped semiconductor layer 140. The electrical transmission channel can serve as a channel for the leakage current of the tunnel junction between P-type doped ions and N-type doped ions (minority carriers and majority carriers), decentralizing the leakage current channel previously in one position, i.e., provide more leakage current discharging positions, thereby relieving the pressure on the single leakage current channel and evenly discharging the leakage current in various places, so as to controllably regulate and solve the leakage current problem of the solar cell, and then effectively reduce the high voltage or overheat events in one electrical contact region or multiple leakage current regions in the back-contact solar cell, so that the "hot spot effect" caused by the problem of local overheating can be solved.

In one or more embodiments, referring to FIG. 3, the conductive layer 110 is located on the substrate 100 corresponding to the gap region 103 and is in electrical contact with the side surface of the corresponding first doped semiconductor layer 120. In this way, the conductive layer 110 is in contact with the side surface of the first doped semiconductor layer 120, that is, the conductive layer 110 is not located on the top surface of the first doped semiconductor layer 120. The conductive layer 110 is located on the surface of the substrate 100, the conductive layer 110 can perform passivation treatment on the surface of the gap region and repair the etching defects on the surface of the gap region. The conductive layer 110 is in contact with the side surface of the first doped semiconductor layer 120, and the contact area of the contact points between a single first doped semiconductor layer 120 and the second doped semiconductor layer 140 can be controlled through a single variable, and then the magnitude of the leakage current can be controlled, making the whole operation more convenient and accurate.

The gap region 103 includes a first treatment region 131 and a second treatment region 132. The first treatment region 131 is the region corresponding to the conductive layer 110, and the second treatment region 132 is the region not corresponding to the conductive layer 110. The region corresponding to the conductive layer 110 may refer to the orthographic projection region of the conductive layer on the substrate, and the region not corresponding to the conductive layer 110 may refer to the portion of the gap region other than the orthographic projection region of the conductive layer on the substrate.

It is worth noting that the shape of the conductive layer 110 in FIG. 3 is only an example. In the example, since the second doped film in the preparation process is located on the first doped semiconductor layer 120, the conductive layer 110 has some protruding structures, and these protruding structures are physically insulated from the first electrode. That is, there is no contact between the protruding structures and the first electrode, so as to control the magnitude of the leakage current. On the premise of ensuring the existence of the leakage current, the back-contact solar cell has relatively high cell efficiency. In one or more embodiments, the surface of the conductive layer presents a flat surface or is in line with the shape of the back side, that is to say, the surface of the conductive layer will not have protruding structures.

In addition, in each figure of the embodiments of the present disclosure, the contact areas of various regions and film layers are all vertical side contacts or surface contacts, and the structures of the film layers are all regular shapes. However, these are only examples. In fact, the contact areas between film layers may also be inclined surfaces that form an acute angle with the vertical direction, which is not limited by the embodiments of the present disclosure.

Figure 8:
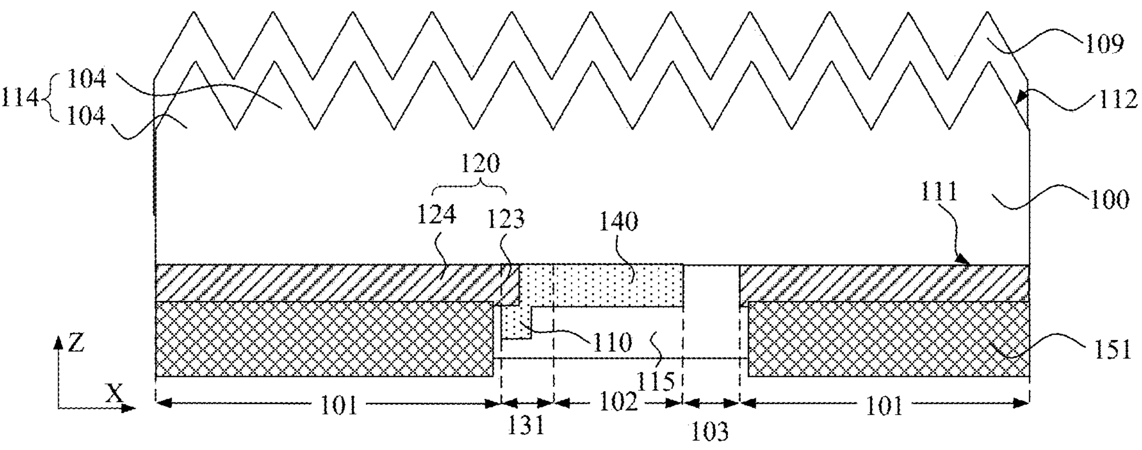
FIG. 8 is a schematic diagram of a fourth sectional structure along B1-B2 section in FIG. 1.
Figure 9:
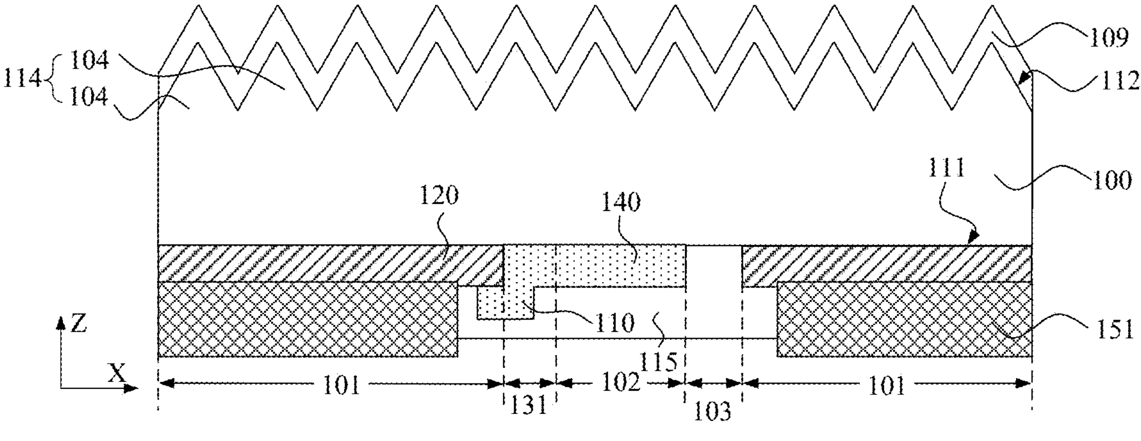
FIG. 9 is a schematic diagram of a fifth sectional structure along B1-B2 section in FIG. 1.
Figure 10:
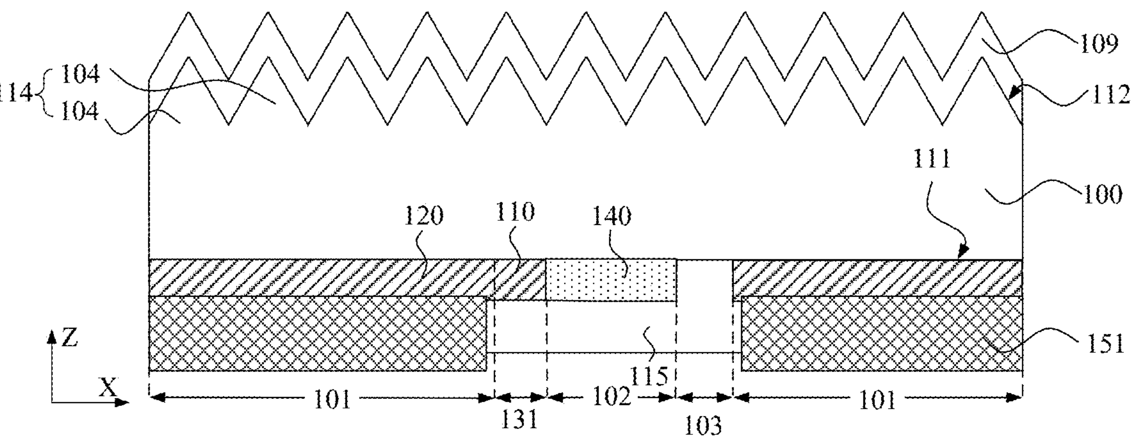
FIG. 10 is a schematic diagram of a sixth sectional structure along B1-B2 section in FIG. 1.

FIG. 8 is a schematic diagram of a fourth sectional structure along the B1-B2 section in FIG. 1. FIG. 9 is a schematic diagram of a fifth sectional structure along the B1-B2 section in FIG. 1. FIG. 10 is a schematic diagram of a sixth sectional structure along the B1-B2 section in FIG. 1.

In one or more embodiments, referring to FIG. 8, the first doped semiconductor layer 120 includes an extension portion 123 located on part of the gap region 103, and the conductive layer 110 is in electrical contact with the top surface and the side surface of the extension portion 123. When the first doped semiconductor layer 120 extends to the gap region, the contact area between the first doped semiconductor layer 120 and the conductive layer 110 may include the side surface and part of the top surface, so that the size of the corresponding conductive layer 110 can be reduced, and both the consumption of the conductive layer 110 and the cost can be reduced. The first doped semiconductor layer 120 located in the first doped region serves as the main body part 124.

It is worth noting that the shape of the conductive layer 110 in FIG. 8 is only an example. In the example, the extension portion does not occupy the entire first treatment region, that is, there is no contact between the extension portion and the second doped semiconductor layer 140. In one or more embodiments, the size relationship between the extension portion and the first treatment region may be set according to actual needs. The extension portion may completely occupy the first treatment region and is also in electrical contact with the second doped semiconductor layer 140. Alternatively, the extension portion may occupy half of the first treatment region.

In one or more embodiments, referring to FIG. 9, the conductive layer 110 further extends to part of the top surface of the first doped semiconductor layer 120 corresponding to the first doped region 101, and the conductive layer 110 is physically insulated from the first electrode 151. In this way, when the contact area between the conductive layer 110 and the first doped semiconductor layer 120 is constant, the consumption of the conductive layer 110 may be correspondingly reduced. Physical insulation means no contact.

In one or more embodiments, referring to FIG. 10, a material of the conductive layer 110 is substantially the same as that of the first doped semiconductor layer 120, for example, the conductive layer and the first doped semiconductor are made of silicon-based materials.

In one or more embodiments, referring to FIG. 3, a material of the conductive layer 110 is substantially the same as that of the second doped semiconductor layer 140, for example, the conductive layer and the second doped semiconductor are made of silicon-based materials.

In one or more embodiments, the extended length of the gap region 103 is a first length, the contact length at which the conductive layer 110 is in contact with the first doped semiconductor layer 120 is a second length, and the ratio of the second length L1 to the first length is less than or equal to 30%. The ratio of the second length L1 to the first length being less than or equal to 30% can ensure that the area of the conductive layer 110 is proper, and the current released by the leakage current caused by the first doped semiconductor layer 120 and the second doped semiconductor layer 140 will not be too large. Therefore, on the premise of ensuring the solar cell efficiency, this leakage current or reverse bias voltage can alleviate the problems of relatively large leakage current in the local area of the whole cell and the thermal problems caused by the "hot spot effect". Moreover, it is also possible to avoid the problems of reduced efficiency in a relatively large PN junction contact area.

In one or more embodiments, the ratio of the second length L1 to the first length may be 10%, 15%, 18%, 23%, 29%.

Figure 11:
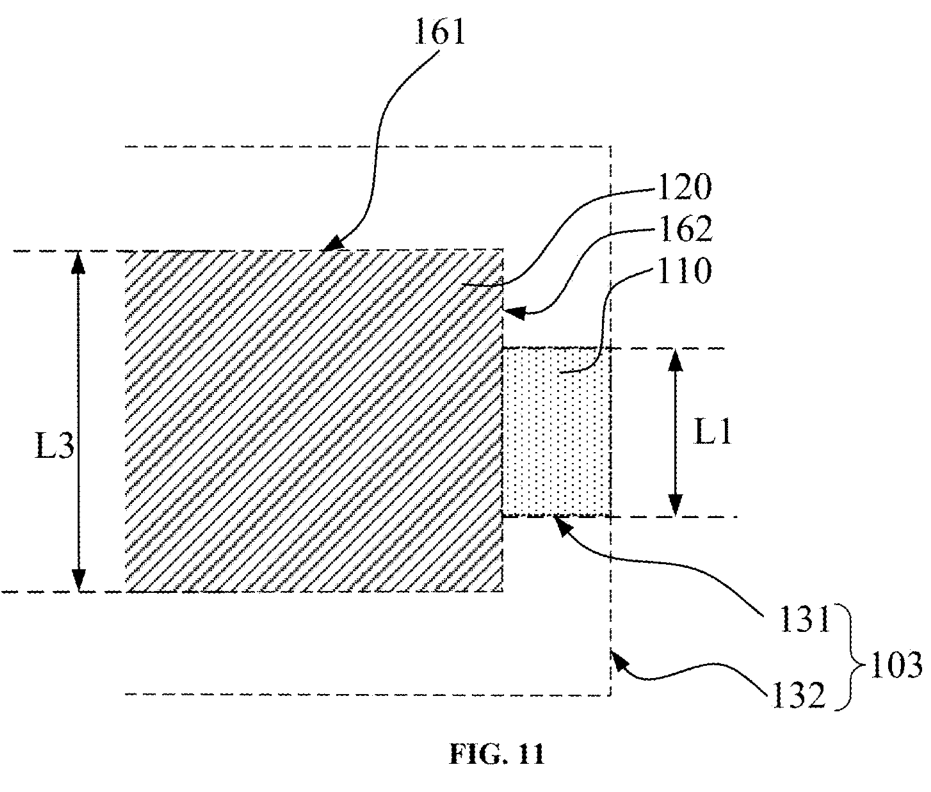
FIG. 11 is a schematic structural diagram of a gap region and a first doped region in a back-contact solar cell according to one or more embodiments of the present disclosure.
Figure 12:
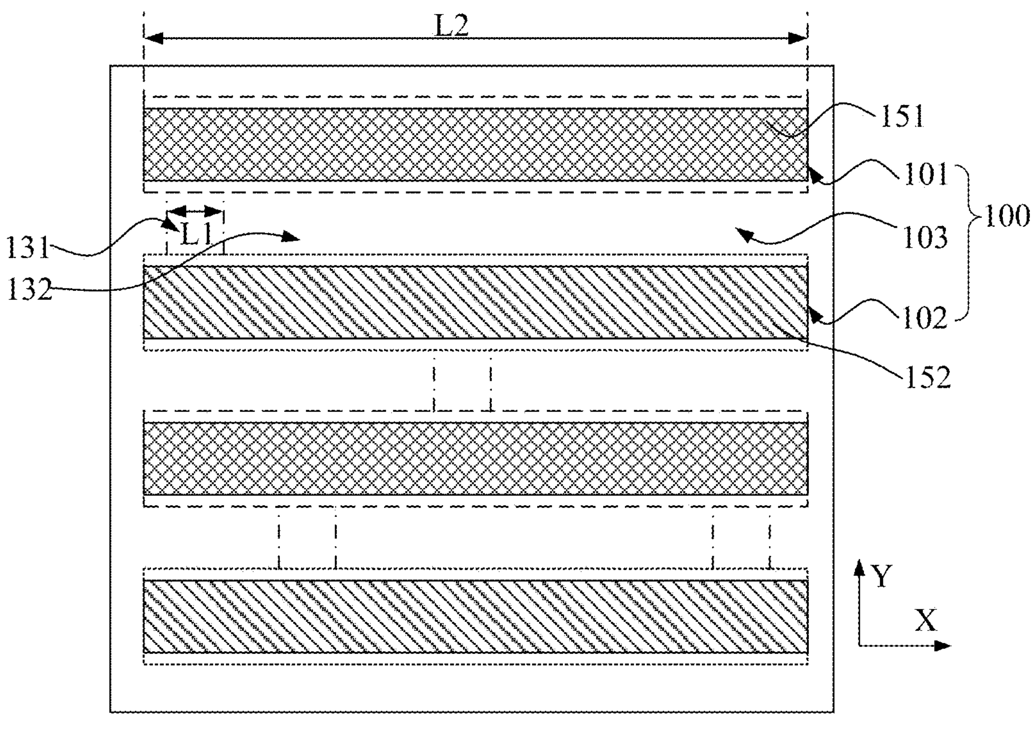
FIG. 12 is another schematic structural diagram of a back-contact solar cell according to one or more embodiments of the present disclosure.

FIG. 11 is a schematic structural diagram of a gap region and a first doped region in a back-contact solar cell according to one or more embodiments of the present disclosure. FIG. 12 is another schematic structural diagram of a back-contact solar cell according to one or more embodiments of the present disclosure.

Referring to FIG. 12, the first doped regions 101 and the second doped regions 102 are alternately arranged along the first direction Y, and the length L2 of the gap region 103 along the second direction X is the extended length of the gap region 103. Referring to FIG. 11, the second doped region 102 surrounds the first doped region 101, and the inner circumference of the gap region 103 is the extended length of the gap region 103. The inner circumference of the gap region 103 refers to the circumference where the orthographic projection graph of the gap region and the first doped region are in contact on the reference plane. In other words, the gap region surrounds the first doped region, the gap region is a hollow annular structure, and the inner circumference refers to the circumference of the cross-sectional graph of the inner part of the hollow annular structure.

In one or more embodiments, referring to FIG. 11, when the inner circumference of the gap region 103 is the extended length of the gap region 103, the respective first doped semiconductor layer 120 includes a long side 161 extending along the first direction Y and a short side 162 extending along the second direction X, and the conductive layer 110 is in electrical contact with the short side 162. In this way, the region corresponding to the short side is relatively large, and there may be a relatively large space for performing corresponding operations on the first treatment region, which can effectively reduce the impact on the surrounding first doped semiconductor layers and second doped semiconductor layers, and improve the accuracy of the conductive layer 110 and the balance of the leakage current.

In one or more embodiments, referring to FIG. 11, the length of the short side 162 is the third length L3, and the ratio of the second length L1 to the third length L3 is greater than or equal to 10%. In this way, the range of the conductive layer 110 can be relatively large, a relatively large area can be applicable for treatment, and the accuracy of the leakage current value can be ensured.

In one or more embodiments, the ratio of the second length L1 to the third length L3 may be 15%, 38%, 59%, 88% or 99%.

In one or more embodiments, the plurality of first doped semiconductor layers 120 includes: a plurality of first portions, where the first portions are first doped semiconductor layers 120 that are in electrical contact with the at least one conductive layer 110; and a plurality of second portions, where the second portions are first doped semiconductor layers 120 that are not in direct contact with the at least one conductive layer 110.

In one or more embodiments, $N1/N \geq 5\%$, N1 is the number of the first portions and N is the total number of the plurality of first doped semiconductor layers 120. A relatively large number of the first portions can divide a leakage current area into a plurality of contact areas, which can avoid the problem of local overheating caused by the hot spot effect, and also ensure the balance of current collection at various positions on the surface of the back-contact solar cell, thereby improving the poor EL appearance and thermal problems of the back-contact solar cell.

In one or more embodiments, the ratio of N1/N may be 10%, 13%, 20% or 30%.

In one or more embodiments, $0 \leq N2 \leq 10$, N2 is the number of the second portions located between two adjacent first portions. By controlling the number of the second portions between the first portions, the distance between two contact areas can be neither too large nor too small, so that the arrangement between the contact areas is more appropriate, the leakage current on the surface of the entire back-contact solar cell is relatively uniform, and the reverse bias voltages generated at various positions are also relatively uniform. This can timely release and balance the current and voltage generated by the hot spot effect at any position, avoiding causing greater damage to the back-contact solar cell.

In one or more embodiments, N2 may be 0, 2, 5, 8 or 10.

In one or more embodiments, the number of the second portions between each two adjacent first parts is the same.

Figure 13:
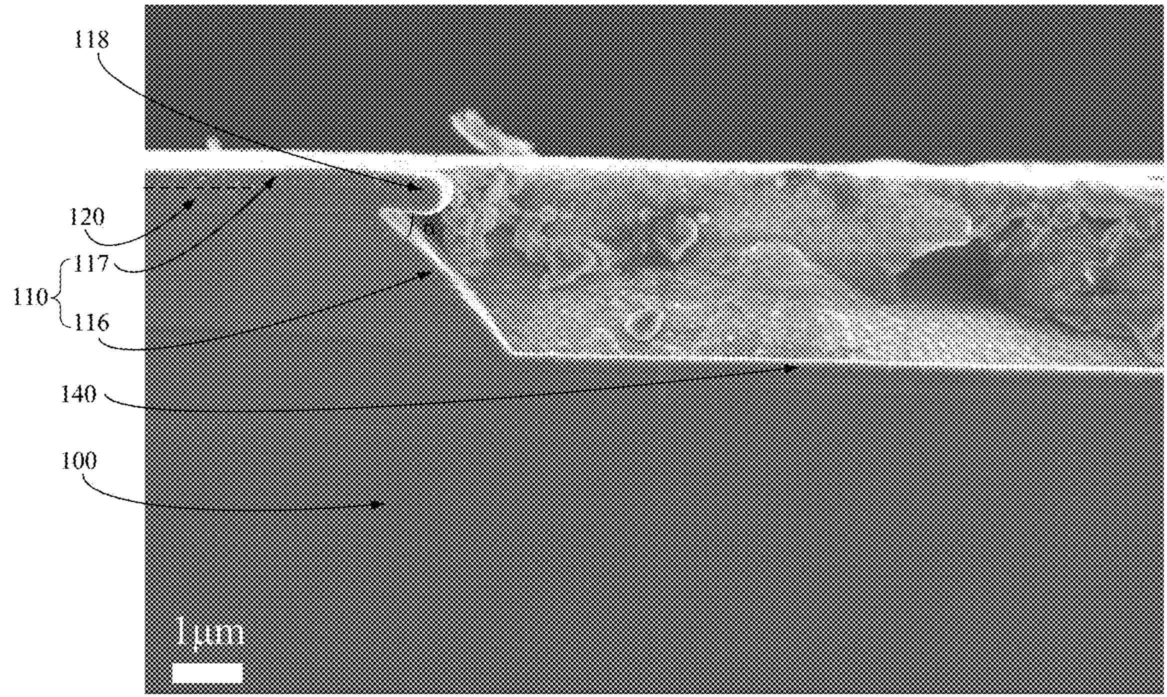
FIG. 13 is an optical microscope image of a first treatment region in a back-contact solar cell according to one or more embodiments of the present disclosure.

In one or more embodiments, FIG. 13 is an optical microscope image of a first treatment region in a back-contact solar cell according to one or more embodiments of the present disclosure. Referring to FIG. 13, the top surface of the second doped semiconductor layer 140 is lower than that of the first doped semiconductor layer 120, and the side surface of the conductive layer 110 is a curved surface.

It is worth noting that in the structure shown in FIG. 13, since the thicknesses of the first doped semiconductor layer and the conductive layer are relatively thin, partial dotted lines are used in the figure to distinguish the layers.

In one or more embodiments, referring to FIG. 13, the conductive layers 110 includes a first conductive layer 116 and a second conductive layer 117. The first conductive layer 116 is located on the side surface of the first doped semiconductor layer 120, and the second conductive layer 117 is located on the top surface of the first doped semiconductor layer 120. An acute angle is formed between the first conductive layer 116 and the bottom surface of the second conductive layer 117. The acute angle indicates that at least one of the first conductive layer and the second conductive layer is not a horizontal plane or a vertical plane but an inclined plane. The inclined plane can increase the internal reflection of sunlight and then improve the photoelectric conversion efficiency.

In one or more embodiments, referring to FIG. 13, the orthographic projection of the first conductive layer 116 on the projection plane is the first projection, the orthographic projection of the second conductive layer 117 on the projection plane is the second projection, and the first projection and the second projection at least partially overlap with each other. In this way, the second conductive layer 117 protrudes from the first conductive layer 116 to form a recessed area. This recessed area can receive sunlight, gather the sunlight within the recessed area, and then the sunlight is absorbed by the substrate to form photogenerated carriers. The recessed structure can increase the internal reflectivity of sunlight, thereby improving the solar cell efficiency of the back-contact solar cell. The projection plane may be the reference plane. For example, the reference plane may be a plane constituted by the first direction Y and the second direction X.

In one or more embodiments, the conductive layer 110 has a brim structure 118. The brim structure is located at the contact area between the first conductive layer 110 and the second conductive layer 110, and the side surface of the brim structure 118 is a curved surface.

Continuing to refer to FIG. 2, the back-contact solar cell includes a passivation layer 115, and the passivation layer 115 covers the first doped semiconductor layer 120, the second doped semiconductor layer 140, the conductive layer 110 and the gap region 103.

In one or more embodiments, the passivation layer 115 may be a single-layer structure or a stacked structure, and a material of the passivation layer 115 may be one or more of material such as silicon oxide, silicon nitride, silicon oxynitride, silicon carbon oxynitride, titanium oxide, hafnium oxide or aluminum oxide.

In one or more embodiments, the back-contact solar cell further includes an anti-reflection layer, and the anti-reflection layer is located on the surface of the passivation layer. The anti-reflection layer is used to reduce or eliminate the reflected light on the surface of the back-contact solar cell, thereby increasing the light transmittance on the surface of the back-contact solar cell and reducing or eliminating the stray light of the system. A material of the anti-reflection layer include silicon nitride or silicon oxynitride.

In one or more embodiments, the front side 112 has a textured structure 114, and the textured structure 114 includes a plurality of pyramid structures 104. The back-contact solar cell also includes a front surface passivation layer 109, and the front surface passivation layer 109 covers the textured structure 114.

In one or more embodiments, the front surface passivation layer 109 may be a single-layer structure or a stacked structure, and a material of the front surface passivation layer 109 may be one or more of material such as silicon oxide, silicon nitride, silicon oxynitride, silicon carbon oxynitride, titanium oxide, hafnium oxide or aluminum oxide.

In one or more embodiments, a material of the front surface passivation layer 109 is substantially the same as that of the passivation layer 115, and the front surface passivation layer 109 and the passivation layer 115 are prepared in the same process.

Continuing to refer to FIG. 2, the back-contact solar cell includes a first electrode 151, and the first electrode 151 is in electrical contact with the first doped semiconductor layer 120.

Continuing to refer to FIG. 2, the back-contact solar cell includes a second electrode 152, and the second electrode 152 is in electrical contact with the second doped semiconductor layer 140.

In one or more embodiments, either the first electrode 151 or the second electrode 152 may be sintered from a burn-through metal paste, and the metal paste may include at least one of silver, aluminum, copper, tin, gold, lead or nickel.

In one or more embodiments, the back side of the substrate may have a concave-convex structure. That is, at least one of the first doped region, the second doped region and the gap region may have a concave-convex structure. The concave-convex structure can increase the internal reflection of incident light, thereby improving the utilization rate of the incident light and further improving the solar cell efficiency of the back-contact solar cell.

In the back-contact solar cell according to the one or more embodiments of the present disclosure, the substrate has a first doped region 101, a second doped region 102 and a gap region 103, and further includes a first doped semiconductor layer 120 located on the first doped region 101, a second doped semiconductor layer 140 located on the second doped region 102 and a conductive layer 110 located on part of the gap region 103. Two sides of the conductive layer 110 are respectively in electrical contact with the first doped semiconductor layer 120 and the second doped semiconductor layer 140, to achieve electrical connection therebetween and further realize electrical transmission therebetween. This electrical transmission channel may serve as a channel for the leakage current of the tunnel junction between P-type doped ions and N-type doped ions (minority carriers and majority carriers), decentralizing the leakage current channel previously in one position, i.e., provide more leakage current discharging positions, thereby relieving the pressure on the single leakage current channel and evenly discharging the leakage current in various places, so as to controllably regulate and solve the leakage current problem of the solar cell. As a result, the high voltage or overheat events in one electrical contact region or multiple leakage current regions in the back-contact solar cell can be avoided, so that the “hot spot effect” caused by the problem of local overheating can be solved.

In addition, for a solar cell string composed of multiple back-contact solar cells, by setting the back-contact solar cell with at least one conductive layer 110, when the solar cell has the hot spot effect, the conductive layer 110 connects the first doped semiconductor layer 120 and the second doped semiconductor layer 140 to produce a reverse bias voltage. The reverse bias voltage balances the increased local current and voltage of the back-contact solar cell itself due to the “hot spot effect”, thereby compensating for the problems brought about by the “hot spot effect”, avoiding issues from occurring in one solar cell string and effectively ensuring the power of the solar cell string when the shading events occur.

Correspondingly, on the other hand, embodiments of the present disclosure also provide a method for manufacturing a back-contact solar cell, which can be used to manufacture the back-contact solar cell according to the above embodiments. The technical features that are the same as or corresponding to those of the above embodiments will not be elaborated in detail here.

FIG. 14 to FIG. 23 are schematic structural diagrams of a back-contact solar cell corresponding to each step of a method for manufacturing a back-contact solar cell according to one or more embodiments of the present disclosure. FIG. 14 to FIG. 23 are for the method for manufacturing the back-contact solar cell corresponding to FIG. 4 in the above embodiments. Embodiments of the present disclosure take the method for manufacturing the back-contact solar cell shown in FIG. 4 as an example for detailed description. For other embodiments, those skilled in the art can make appropriate adjustments in combination with the corresponding preparation methods, which are not described in detail by the embodiments of the present disclosure.

Figure 14:
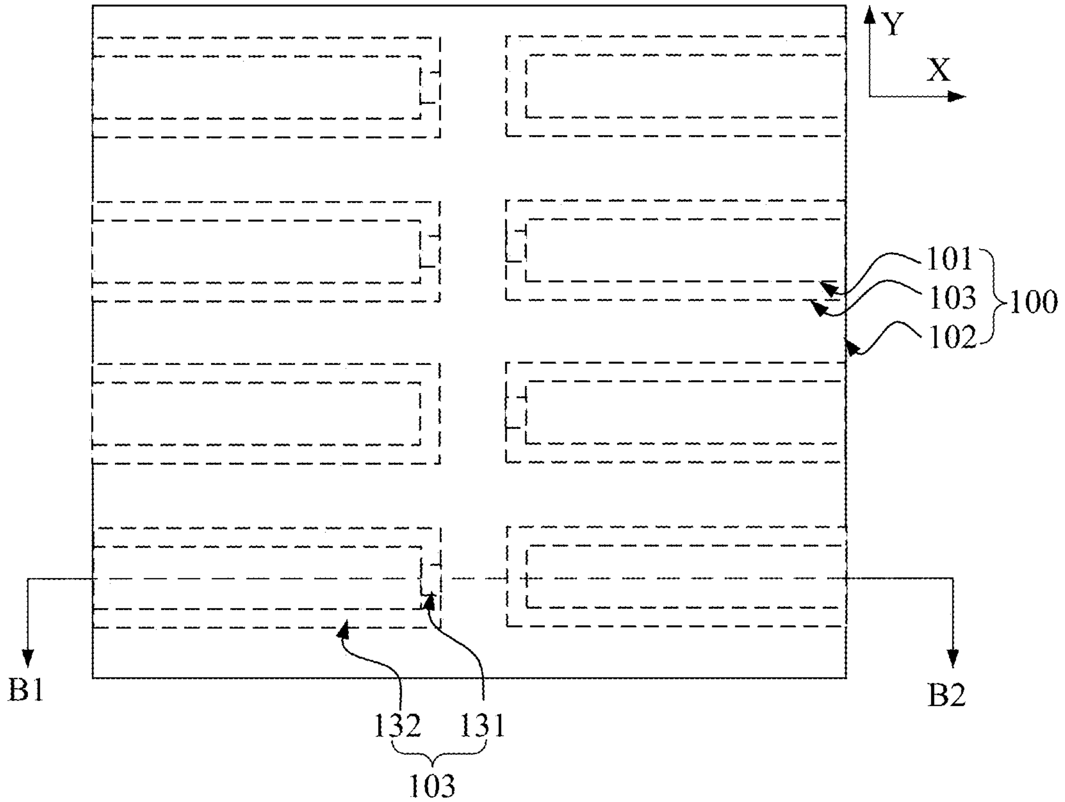
FIG. 14 is a schematic structural diagram of a back-contact solar cell corresponding to providing a substrate in a method for manufacturing a back-contact solar cell according to one or more embodiments of the present disclosure.
Figure 15:
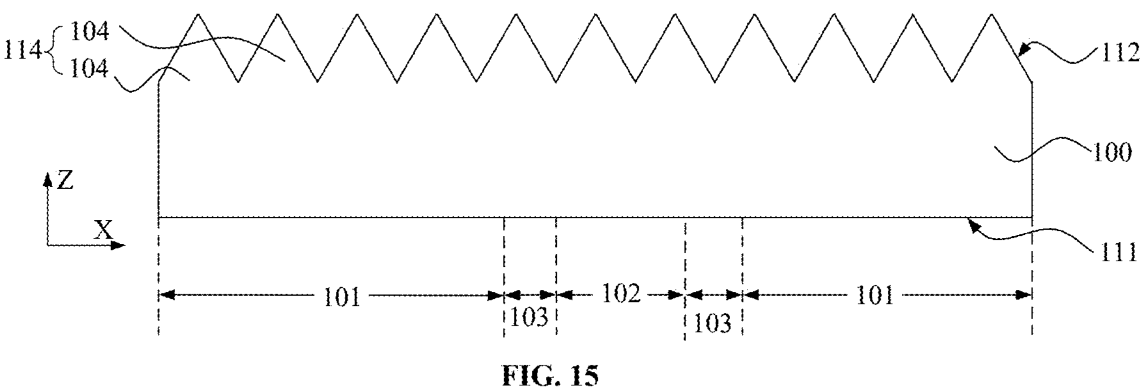
FIG. 15 is a schematic diagram of a sectional structure along B1-B2 section in FIG. 14.

Referring to FIG. 14 and FIG. 15, the preparation method includes: providing a substrate 100. The substrate 100 has a plurality of first doped regions 101 arranged along the first direction Y. Second doped regions are formed 102 between adjacent first doped regions 101, and gap regions 103 are each formed between the adjacent first doped regions 101 and second doped regions 102.

A raw substrate is provided. The first surface and the second surface of the raw substrate are trimmed flat surfaces. A texturing treatment is carried out on the first surface. The texturing treatment includes: chemical etching. For example, a mixed solution of potassium hydroxide and hydrogen peroxide solution may be used to clean the raw substrate. For example, the ratio of the concentrations of potassium hydroxide and hydrogen peroxide solution can be controlled to form a textured structure 114 with an expected morphology. In one or more other embodiments, methods such as laser etching, mechanical methods or plasma etching may also be used to form the textured structure. In laser etching, the laser process parameters are controlled to obtain a textured structure with an expected morphology. The textured structure 114 includes a plurality of pyramid structures 104, and the remaining raw substrate serves as the substrate 100. The first surface of the substrate serves as the front side 112, and the second surface of the substrate serves as the back side 111.

In one or more embodiments, after the textured structure 114 is formed, a polishing treatment is also carried out on the back side 111 of the substrate 100 to make the back side 111 of the substrate 100 form a polished surface.

Referring to FIG. 16 to FIG. 19, the first doped semiconductor layer 120 is formed on the corresponding first doped region 101, and there is a first doping element within the first doped semiconductor layer 120.

Figure 16:
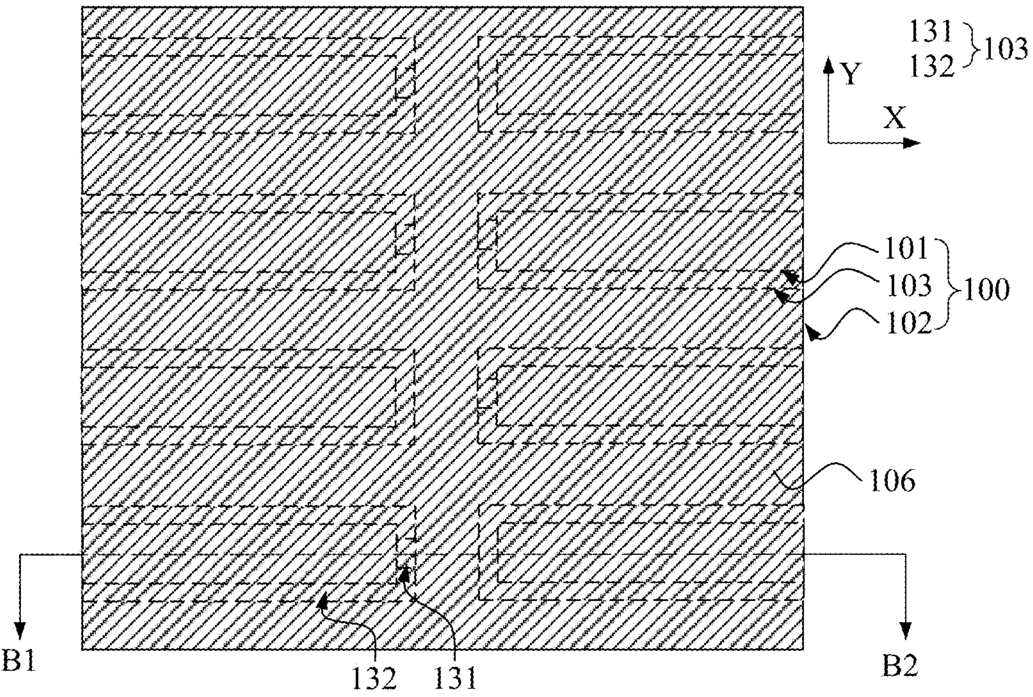
FIG. 16 is a schematic structural diagram of a back-contact solar cell corresponding to forming a first doped film in a method for manufacturing a back-contact solar cell according to one or more embodiments of the present disclosure.
Figure 17:
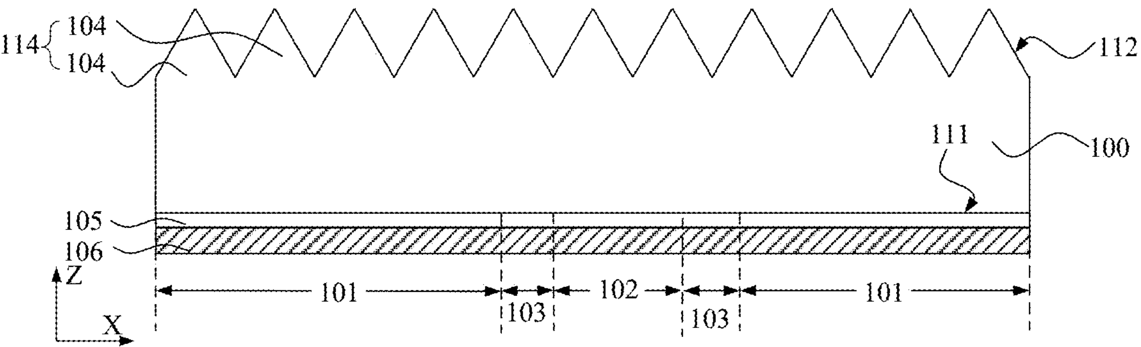
FIG. 17 is a schematic diagram of a sectional structure along B1-B2 section in FIG. 16.
Figure 18:
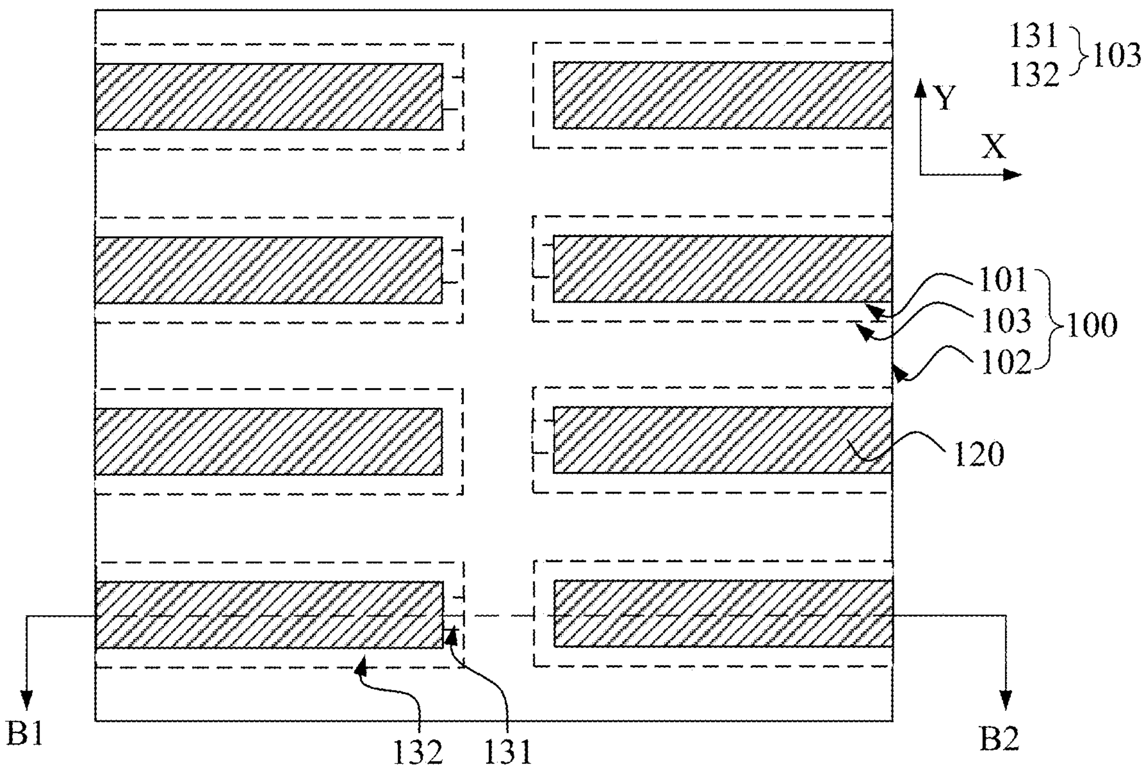
FIG. 18 is a schematic structural diagram of a back-contact solar cell corresponding to removing a first doped film on a second doped region in a method for manufacturing a back-contact solar cell according to one or more embodiments of the present disclosure.
Figure 19:
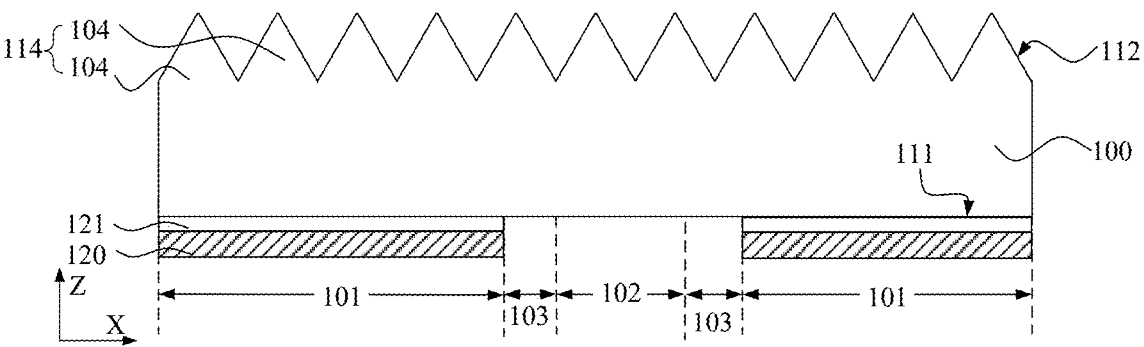
FIG. 19 is a schematic diagram of a sectional structure along B1-B2 section in FIG. 18.
Figure 20:
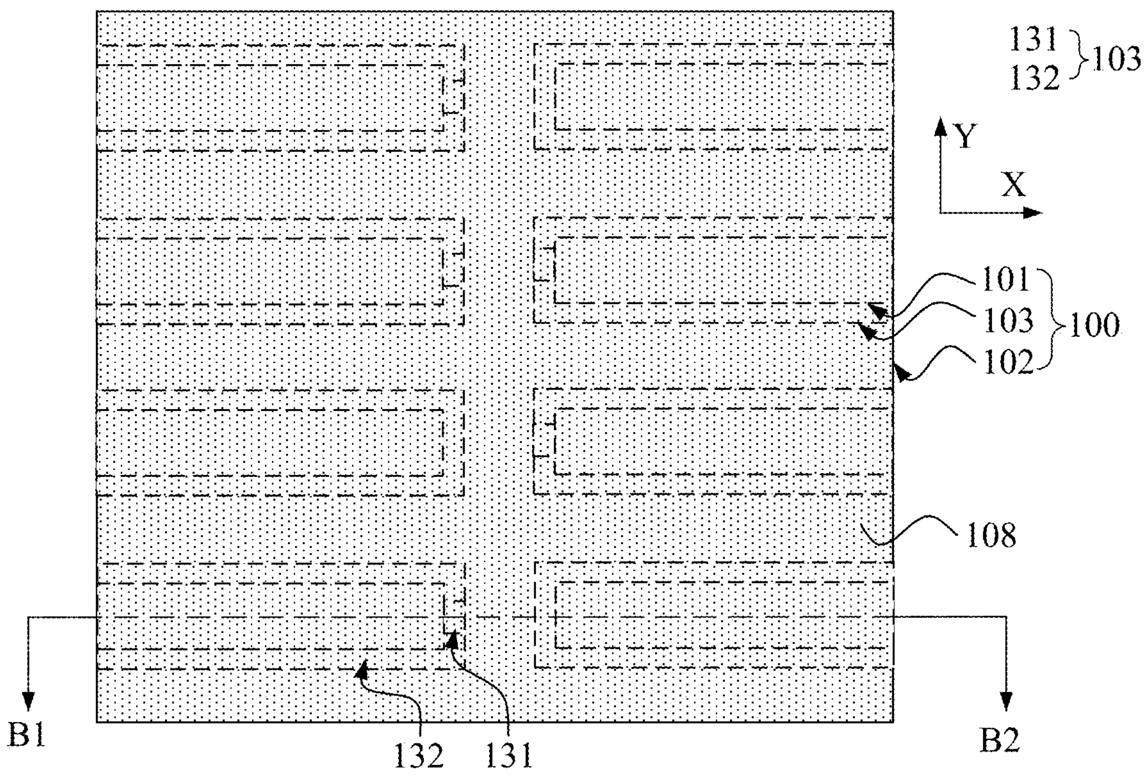
FIG. 20 is a schematic structural diagram of a back-contact solar cell corresponding to forming a second doped film in a method for manufacturing a back-contact solar cell according to one or more embodiments of the present disclosure.
Figure 21:
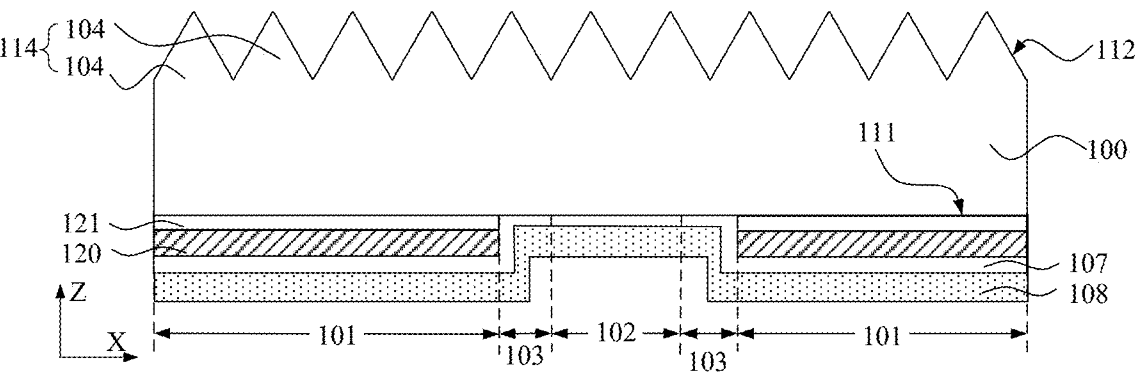
FIG. 21 is a schematic diagram of a sectional structure along B1-B2 section in FIG. 20.
Figure 22:
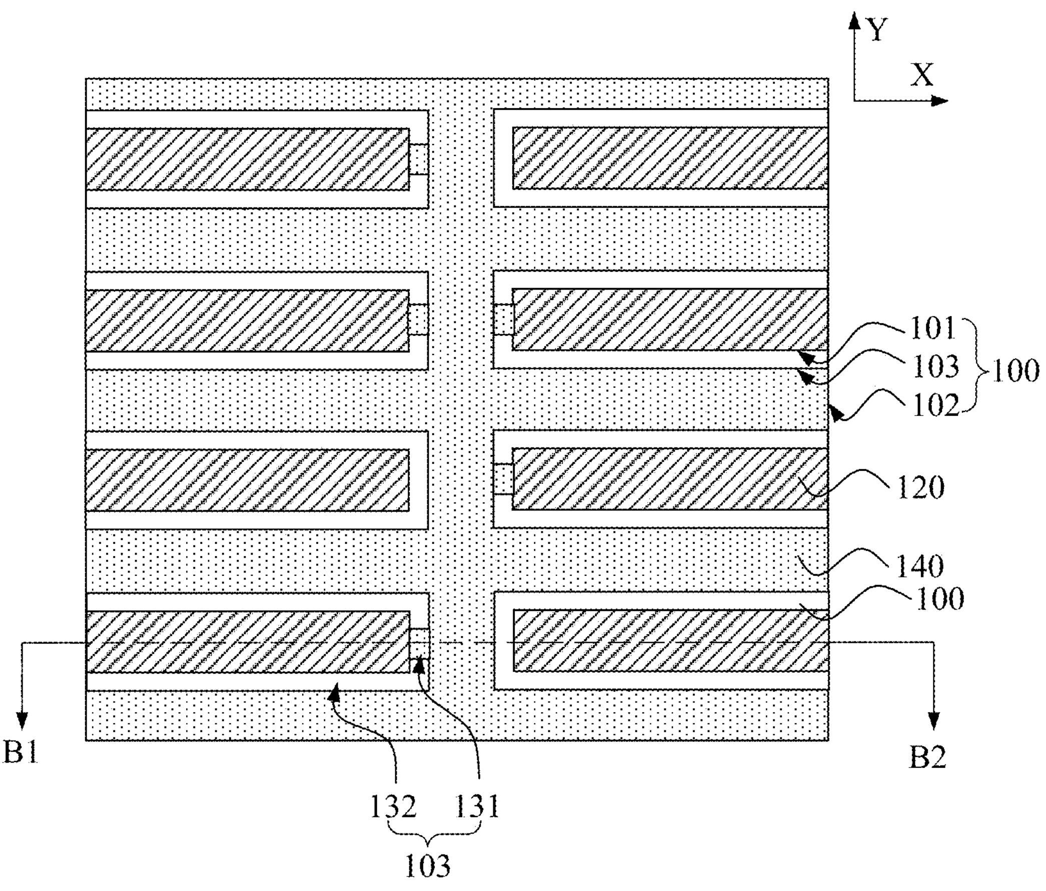
FIG. 22 is a schematic structural diagram of a back-contact solar cell corresponding to removing a second doped film on a first doped region in a method for manufacturing a back-contact solar cell according to one or more embodiments of the present disclosure.
Figure 23:
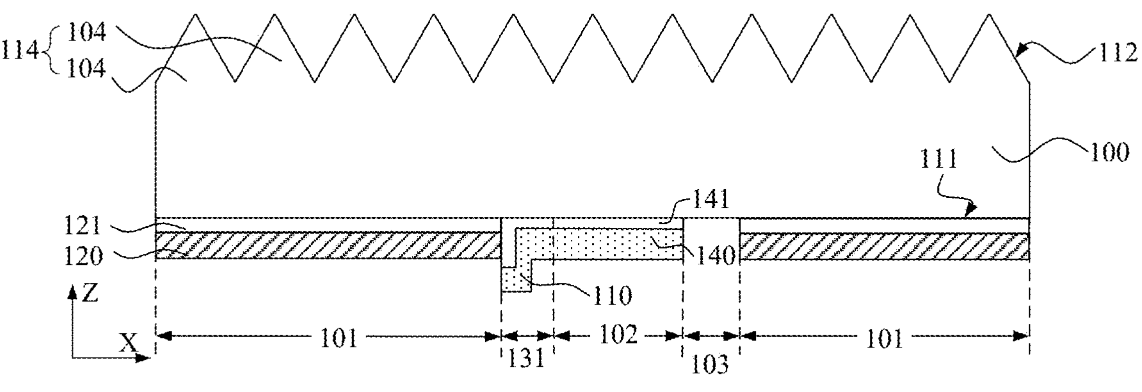
FIG. 23 is a schematic diagram of a sectional structure along B1-B2 section in FIG. 22.

In one or more embodiments, the process steps of forming the first doped semiconductor layer 120 include: forming a first dielectric film 105 and a first doped film 106 on the first doped region 101, the gap region 103 and the second doped region 102, with the first doped film on the surface of the first dielectric film 105 with reference to FIG. 16 and FIG. 17; and removing the first doped film 106 and the first dielectric film 105 on the second doped region 102, with the first doped film 106 on the first doped region 101 serving as the first doped semiconductor layer 120, and the first dielectric film 105 is the first tunneling dielectric layer 121 with reference to FIG. 18 and FIG. 19.

If the back-contact solar cell shown in FIG. 10 is to be formed, the gap region 103 includes a first treatment region 131 and a second treatment region 132, and the first doped film 106 is located on the first treatment region 131 and the second treatment region 132. The process of removing the first doped film 106 on the second doped region 102, further includes: removing the first doped film 106 on the second treatment region 132, with the remaining first doped film 106 on the first treatment region 131 serving as the conductive layer. The conductive layer 110 is located on the first treatment region 131.

To form the back-contact solar cell shown in FIG. 8, the process of removing the first doped film 106 on the second doped region 102, further includes: removing the first doped film 106 on the second treatment region 132 and part of the first doped film 106 on the first treatment region 131, with the remaining first doped film 106 on the first treatment region 131 serving as the extension portion. The conductive layer 110 is located on the first treatment region 131.

Referring to FIG. 20 to FIG. 23, the second doped semiconductor layer 140 is formed on the corresponding second doped region 102, and a second doping element with a different conductive type from that of the first doping element is formed within the second doped semiconductor layer 140. The conductive layer 110 is formed on part of the gap region 103. One side of the conductive layer 110 is in electrical contact with the first doped semiconductor layer 120, and the other side of the conductive layer 110 is in electrical contact with the second doped semiconductor layer 140.

In one or more embodiments, the process of removing the first doped film 106 on the second doped region 102, further includes: removing the first doped film 106 and the first dielectric film 105 on the first treatment region 131 with reference to FIG. 19. The process steps of forming the second doped semiconductor layer 140 include: forming a second dielectric film 107 and a second doped film 108 on the surface of the first doped semiconductor layer 120, the first treatment region 131, the second treatment region 132 and the second doped region 102, with the second doped film 108 located on the surface of the second dielectric film 107 with reference to FIG. 20 and FIG. 21; and removing the second dielectric film 107 and the second doped film 108 on the first doped semiconductor layer 120 and the second treatment region 132, with the second doped film 108 on the first treatment region 131 serving as the conductive layer 110, the second doped film 108 on the second doped region 102 serving as the second doped semiconductor layer 140, and the remaining second dielectric film serving as the second tunneling dielectric layer 141 with reference to FIG. 22 and FIG. 23.

In one or more embodiments, the removal of the film layers in the above various regions may be achieved by a mask and an etching process, or by a patterning treatment. The mask may include any one of ink, paraffin and doped silicon glass layer. The etching process may include any one of a dry etching process, a wet etching process or a laser etching process.

Each process for forming the respective film layers mentioned above may include a chemical vapor deposition process or a physical vapor deposition process.

Referring to FIG. 4 and FIG. 5, a passivation layer 115 is formed, and the passivation layer 115 covers the first doped semiconductor layer 120, the second doped semiconductor layer 140, the conductive layer 110 and the gap region 103. A first electrode 151 is formed, and the first electrode 151 is in electrical contact with the first doped semiconductor layer 120. A second electrode 152 is formed, and the second electrode 152 is in electrical contact with the second doped semiconductor layer 140.

Correspondingly, embodiments of the present disclosure also provide a photovoltaic module, which includes back-contact solar cells of any one of the above embodiments or back-contact solar cells manufactured by the method for manufacturing the back-contact solar cell according to the above embodiments. The technical features that are the same as or corresponding to those of the above embodiments will not be elaborated in detail here.

Figure 24:
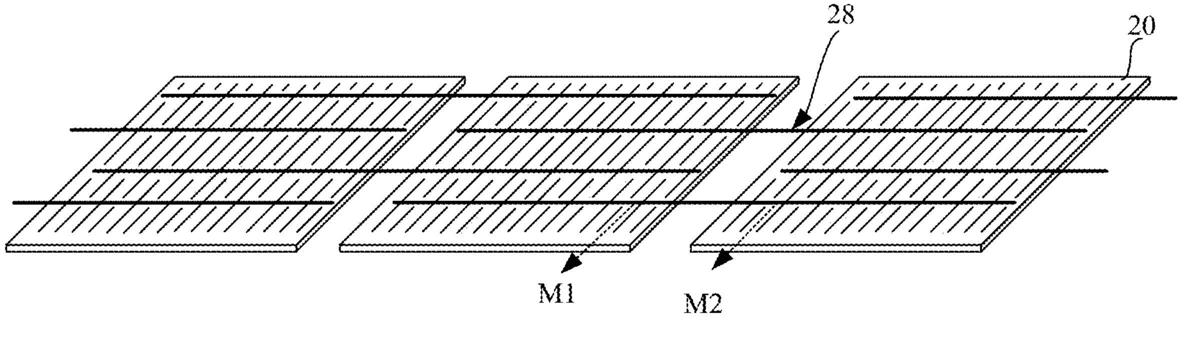
FIG. 24 is a schematic structural diagram of a photovoltaic module according to one or more embodiments of the present disclosure.
Figure 25:
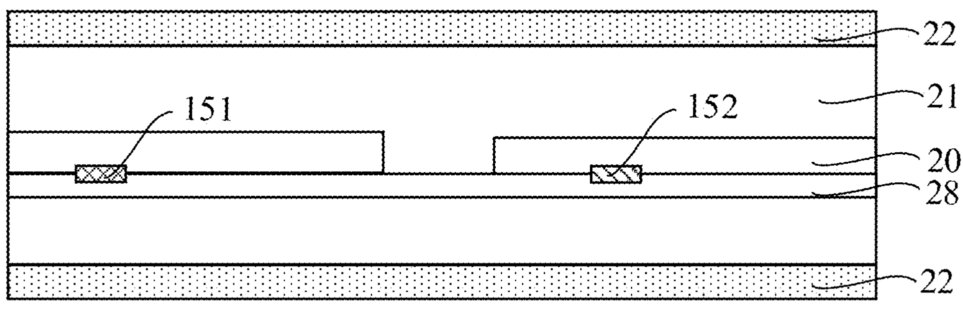
FIG. 25 is a schematic diagram of a sectional structure along M1-M2 section in FIG. 24.

FIG. 24 is a schematic structural diagram of a photovoltaic module according to one or more embodiments of the present disclosure. FIG. 25 is a schematic diagram of a sectional structure along the M1-M2 section in FIG. 24. In order to illustrate the connection relationship between the connecting members and the solar cells, the surface in FIG. 24 shows the structure of the back side of the substrate, and the encapsulation film and the cover plate are not shown.

Referring to FIG. 24 and FIG. 25, a photovoltaic module includes: a solar cell string formed by connecting multiple back-contact solar cells 20 of any one of the above embodiments or back-contact solar cells 20 manufactured by the method for manufacturing any one of the above embodiments; connecting members 28 configured to electrically connect two adjacent back-contact solar cells 20; an encapsulation film 21 configured to cover a surface of the solar cell string; and a cover plate 22 configured to cover the surface of the encapsulation film 21 away from the solar cell string.

In one or more embodiments, multiple back-contact solar cells 20 may be electrically connected through the connecting members 28, and the connecting members 28 are soldered to busbars/fingers of the solar cells.

In one or more embodiments, the connecting members 28 are soldered to the fingers of the solar cells, and the fingers include the first electrode 151 and the second electrode 152. In one or more embodiments, the connecting members 28 are soldered to the busbars of the solar cells, and the busbars includes a first busbar and a second busbar, and the first busbar is soldered to the first electrode and the second busbar is soldered to the second electrode.

In one or more embodiments, the encapsulation film 21 includes a first encapsulation film and a second encapsulation film. One of the first encapsulation film and the second encapsulation film covers one of the front surface and the back side of the back-contact solar cell, and the other one covers the other one of the front surface and the back side of the back-contact solar cell. For example, at least one of the first encapsulation film and the second encapsulation film may be an organic encapsulation film such as a Polyvinyl Butyral (PVB) film, an Ethylene-Vinyl Acetate (EVA) film, a Polyolefin Elastomer (POE) film or a Polyethylene Terephthalate (PET) film.

It is worth noting that there is a boundary line between the first encapsulation film and the second encapsulation film before the lamination process. After the lamination process and the photovoltaic module is formed, there is no difference between the first encapsulation film and the second encapsulation film. That is, the first encapsulation film and the second encapsulation film have already formed an integral encapsulation film 21.

In one or more embodiments, the cover plate 22 may be a cover plate with a light-transmitting function, such as a glass cover plate or a plastic cover plate. For example, the surface of the cover plate 22 facing the encapsulation film 21 may be a concave-convex surface, so as to increase the utilization rate of incident light. The cover plate 22 includes a first cover plate and a second cover plate. The first cover plate is opposite to the first encapsulation film, and the second cover plate is opposite to the second encapsulation film. Alternatively, the first cover plate is opposite to one side of the back-contact solar cell, and the second cover plate is opposite to the other side of the back-contact solar cell.

Person of ordinary skill in the art can understand that the above-mentioned implementation manners are specific embodiments for realizing the present disclosure. In practical applications, various changes can be made in form and detail without departing from the spirit and scope of the present disclosure. Any person skilled in the art can make various changes and modifications without departing from the spirit and scope of the present disclosure. Therefore, the protection scope of the present disclosure should be subject to the scope defined by the claims.

What is claimed is:

1. A back-contact solar cell, comprising:

a substrate, including a plurality of first doped regions spaced apart along a first direction, a plurality of second doped regions arranged along the first direction, and gap regions, wherein at least a portion of each of the plurality of second doped regions is between respective adjacent first doped regions of the plurality of first doped regions, and a respective gap region of the gap regions is between each first doped region and an adjacent second doped region;

first doped semiconductor layers, respectively formed on the plurality of first doped regions, wherein each of the plurality of first doped semiconductor layers includes a first doping element;

second doped semiconductor layers, respectively formed on the plurality of second doped regions, wherein each of the plurality of second doped semiconductor layers includes a second doping element, and a conductive type of the second doping element is different from a conductive type of the first doping element;

at least one conductive layer, wherein each respective conductive layer of the at least one conductive layer is formed on part of a corresponding gap region, wherein a first side of the respective conductive layer is in electrical contact with a respective first doped semiconductor layer, and an opposing second side of the respective conductive layer is in electrical contact with a respective second doped semiconductor layer adjacent to the respective first doped semiconductor layer;

a passivation layer, formed over the first doped semiconductor layers, the second doped semiconductor layers, the at least one conductive layer and the gap regions;

first electrodes in electrical contact with the first doped semiconductor layers; and second electrodes in electrical contact with the second doped semiconductor layers;

wherein the respective conductive layer includes a first conductive layer and a second conductive layer, the first conductive layer is located on a side surface of the respective first doped semiconductor layer, the second conductive layer includes a first portion located on a top surface of the respective first doped semiconductor layer, a second portion abutting the first portion and located on a top edge of the first conductive layer, and a third portion abutting the second portion and protruding beyond the first conductive layer, a bottom surface of the third portion and a surface of the first conductive layer facing away from the side surface of the respective first doped semiconductor layer forming an acute angle and a recessed area in an outer surface of the respective conductive layer facing away from the respective first doped semiconductor layer.

2. The back-contact solar cell according to claim 1, wherein a ratio of a contact length where the respective conductive layer is in contact with the respective first doped semiconductor layer to an extended length of the corresponding gap region is less than or equal to 30%; and wherein in response to the first doped regions and the second doped regions being alternatingly arranged along the first direction, a length of the corresponding gap region along a second direction is the extended length of the corresponding gap region, and in response to the respective second doped region surrounding the respective first doped region, an inner circumference of the corresponding gap region is the extended length of the corresponding gap region.

3. The back-contact solar cell according to claim 2, wherein in response to the inner circumference of the corresponding gap region being the extended length of the corresponding gap region, the respective first doped semiconductor layer includes a long side extending along the first direction and a short side extending along the second direction, and the respective conductive layer is in electrical contact with the short side of the respective first doped semiconductor layer.

4. The back-contact solar cell according to claim 3, wherein a ratio of the contact length to a length of the short side is greater than or equal to 10%.

5. The back-contact solar cell according to claim 1, wherein the first doped semiconductor layers include:

a plurality of first portions, wherein the plurality of first portions are ones of the first doped semiconductor layers that are in electrical contact with the at least one conductive layer; and a plurality of second portions, wherein the plurality of second portions are ones of the first doped semiconductor layers that are not in direct contact with the at least one conductive layer;

wherein $N1/N \geq 5\%$, N1 is a number of the plurality of first portions, and N is a total number of the first doped semiconductor layers.

6. The back-contact solar cell according to claim 5, wherein $0 \leq N2 \leq 10$, N2 is a number of second portions located between two adjacent first portions of the plurality of first portions.

7. The back-contact solar cell according to claim 5, wherein a number of second portions between each two adjacent first portions of the plurality of first portions is the same.

8. The back-contact solar cell according to claim 6, wherein a number of second portions between each two adjacent first portions of the plurality of first portions is the same.

9. The back-contact solar cell according to claim 1, wherein the respective first doped semiconductor layer includes an extension portion located on part of the corresponding gap region, and the respective conductive layer is in electrical contact with both a top surface and a side surface of the extension portion.

10. The back-contact solar cell according to claim 1, wherein the respective conductive layer is physically insulated from the first electrodes.

11. The back-contact solar cell according to claim 10, wherein a top surface of the respective second doped semiconductor layer is lower than the top surface of the respective first doped semiconductor layer.

12. The back-contact solar cell according to claim 1, wherein an orthographic projection of the first conductive layer on a projection plane at least partially overlap an orthographic projection of the second conductive layer on the projection plane.

13. The back-contact solar cell according to claim 1, wherein a material of the respective conductive layer is substantially the same as a material of at least one of the respective first doped semiconductor layer and the respective second doped semiconductor layer.

14. The back-contact solar cell according to claim 1, wherein the respective conductive layer has a brim structure located at a contact area between the first conductive layer and the second conductive layer, and a side surface of the brim structure is a curved surface.

15. A photovoltaic module, comprising:

at least one solar cell string, each formed by connecting a plurality of back-contact solar cells;

a connecting member, configured to electrically connect two adjacent back-contact solar cells of the plurality of back-contact solar cells;

an encapsulation film, configured to cover a surface of the at least one solar cell string; and a cover plate, configured to cover a surface of the encapsulation film that is away from the at least one solar cell string;

wherein each of the plurality of back-contact solar cells includes:

a substrate, including a plurality of first doped regions spaced apart along a first direction, a plurality of second doped regions arranged along the first direction, and gap regions, wherein at least a portion of each of the plurality of second doped regions is between respective adjacent first doped regions of the plurality of first doped regions, and a respective gap region of the gap regions is between each first doped region and an adjacent second doped region;

first doped semiconductor layers, respectively formed on the plurality of first doped regions, wherein each of the plurality of first doped semiconductor layers includes a first doping element;

second doped semiconductor layers, respectively formed on the plurality of second doped regions, wherein each of the plurality of second doped semiconductor layers includes a second doping element, and a conductive type of the second doping element is different from a conductive type of the first doping element;

at least one conductive layer, wherein each respective conductive layer of the at least one conductive layer is formed on part of a corresponding gap region, wherein a first side of the respective conductive layer is in electrical contact with a respective first doped semiconductor layer, and an opposing second side of the respective conductive layer is in electrical contact with a respective second doped semiconductor layer adjacent to the respective first doped semiconductor layer;

a passivation layer, formed over the first doped semiconductor layers, the second doped semiconductor layers, the at least one conductive layer and the gap regions;

first electrodes in electrical contact with the first doped semiconductor layers; and second electrodes in electrical contact with the second doped semiconductor layers;

wherein the respective conductive layer includes a first conductive layer and a second conductive layer, the first conductive layer is located on a side surface of the respective first doped semiconductor layer, the second conductive layer includes a first portion located on a top surface of the respective first doped semiconductor layer, a second portion abutting the first portion and located on a top edge of the first conductive layer, and a third portion abutting the second portion and protruding beyond the first conductive layer, a bottom surface of the third portion and a surface of the first conductive layer facing away from the side surface of the respective first doped semiconductor layer forming an acute angle and a recessed area in an outer surface of the respective conductive layer facing away from the respective first doped semiconductor layer.

16. The photovoltaic module according to claim 15, wherein a ratio of a contact length where the respective conductive layer is in contact with the respective first doped semiconductor layer to an extended length of the corresponding gap region is less than or equal to 30%; and wherein in response to the first doped regions and the second doped regions being alternatingly arranged along the first direction, a length of the corresponding gap region along a second direction is the extended length of the corresponding gap region, and in response to the respective second doped region surrounding the respective first doped region, an inner circumference of the corresponding gap region is the extended length of the corresponding gap region.

17. The photovoltaic module according to claim 16, wherein in response to the inner circumference of the corresponding gap region being the extended length of the corresponding gap region, the respective first doped semiconductor layer includes a long side extending along the first direction and a short side extending along the second direction, and the respective conductive layer is in electrical contact with the short side of the respective first doped semiconductor layer.

18. The photovoltaic module according to claim 17, wherein a ratio of the contact length to a length of the short side is greater than or equal to 10%.

* * * * *